(12) United States Patent
Lee et al.

(10) Patent No.: US 10,439,166 B2
(45) Date of Patent: Oct. 8, 2019

(54) DISPLAY DEVICE AND METHOD FOR MANUFACTURING THE SAME

(71) Applicant: Samsung Display Co., Ltd., Yongin-si, Gyeonggi-do (KR)

(72) Inventors: Kang-yong Lee, Seoul (KR); Sungmin Kim, Yongin-si (KR); Kyungjun Park, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 10 days.

(21) Appl. No.: 15/623,128

(22) Filed: Jun. 14, 2017

(65) Prior Publication Data

US 2018/0006272 A1  Jan. 4, 2018

(30) Foreign Application Priority Data

Jul. 1, 2016  (KR) .................. 10-2016-0083655

(51) Int. Cl.
| | |
|---|---|
| *H01L 29/205* | (2006.01) |
| *H01L 33/00* | (2010.01) |
| *H01L 51/52* | (2006.01) |
| *G06F 3/041* | (2006.01) |
| *G06F 3/044* | (2006.01) |
| *H01L 27/32* | (2006.01) |

(52) U.S. Cl.
CPC .......... *H01L 51/5262* (2013.01); *G06F 3/044* (2013.01); *G06F 3/0412* (2013.01); *H01L 27/323* (2013.01); *H01L 27/3272* (2013.01); *H01L 51/5284* (2013.01); *G06F 2203/04103* (2013.01); *G06F 2203/04111* (2013.01); *G06F 2203/04112* (2013.01); *H01L 27/3244* (2013.01); *H01L 51/5237* (2013.01); *H01L 2251/5315* (2013.01)

(58) Field of Classification Search
None
See application file for complete search history.

(56) References Cited

U.S. PATENT DOCUMENTS

| | | | |
|---|---|---|---|
| 6,731,431 B2 * | 5/2004 | Sekine | G02B 3/08 156/99 |
| 9,136,406 B2 * | 9/2015 | Iizuka | H01L 31/02325 |

(Continued)

FOREIGN PATENT DOCUMENTS

| | | | |
|---|---|---|---|
| JP | 2006-079978 A | 3/2006 | |
| JP | 2006-309956 A | 11/2006 | |

(Continued)

OTHER PUBLICATIONS

"View Control Film", Shin Etsu Polymer Europe B.V., https://www.shinetsu.info/vc_film&sq=view+control, pp. 1-5.

*Primary Examiner* — Calvin Y Choi
(74) *Attorney, Agent, or Firm* — Innovation Counsel LLP

(57) ABSTRACT

Provided is a display device. The display device includes a first substrate including a first base layer, a circuit layer disposed on the first base layer, and a light emitting layer disposed on the circuit layer, a second substrate including a top surface and a bottom surface and in which a plurality of grooves arranged in a first direction are defined in the bottom surface, the second substrate being disposed on the first substrate, and a plurality of light blocking members disposed on the plurality of grooves to control propagation direction of light outputted from the light emitting layer.

13 Claims, 25 Drawing Sheets

(56) References Cited

U.S. PATENT DOCUMENTS

2002/0175888 A1\* 11/2002 Murade ............... G02F 1/13454
                                                    345/92
2013/0050798 A1\* 2/2013 Kim ..................... G02F 1/1323
                                                    359/275
2014/0220313 A1\* 8/2014 Kim ..................... G02B 5/201
                                                    428/195.1

FOREIGN PATENT DOCUMENTS

| JP | 2013-205509 A | 10/2013 |
| JP | 2015-105368 A | 6/2015 |
| JP | 2016-000531 A | 1/2016 |
| KR | 10-2005-0014890 A | 2/2005 |
| KR | 10-2014-0036265 A | 3/2014 |

\* cited by examiner

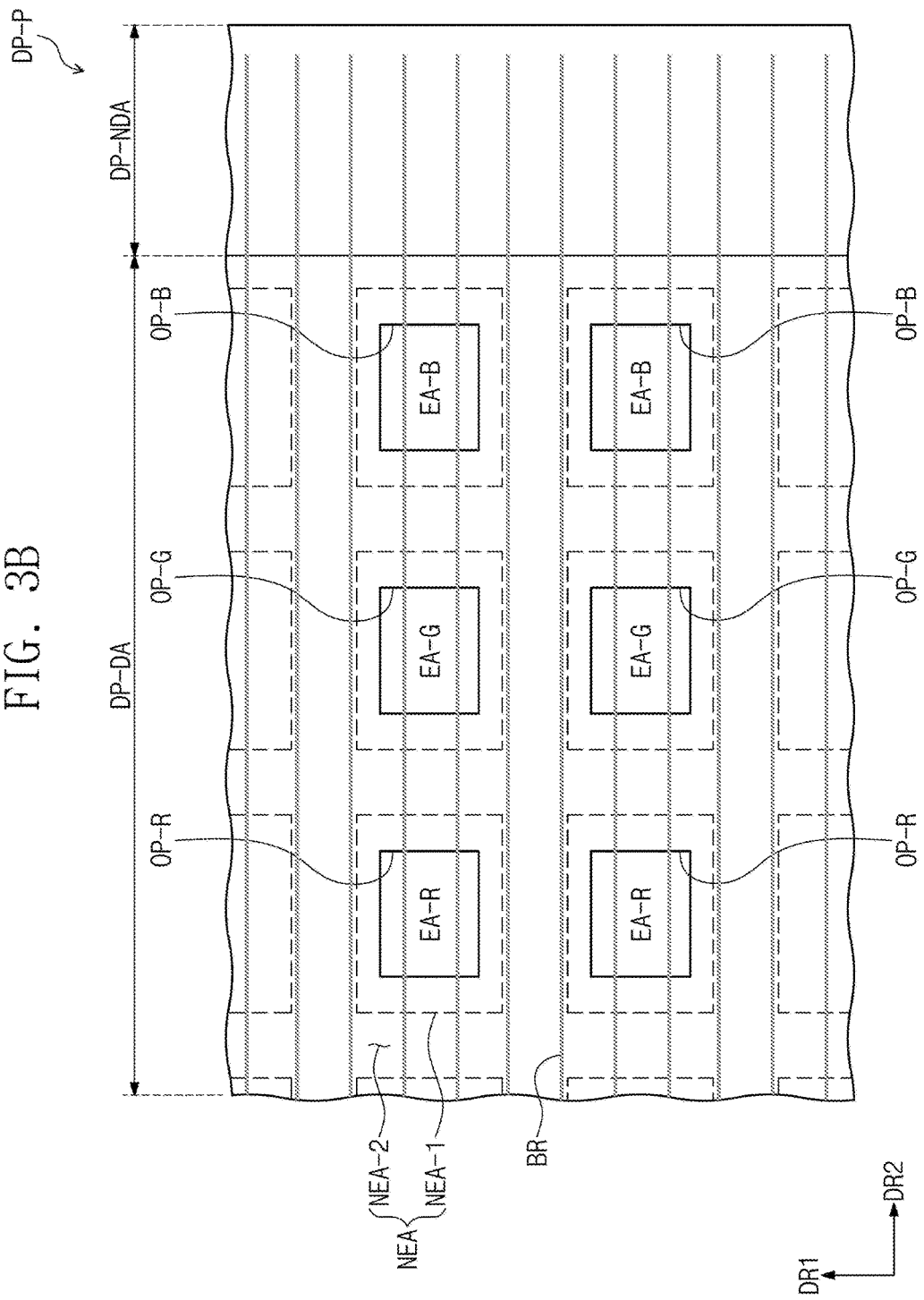

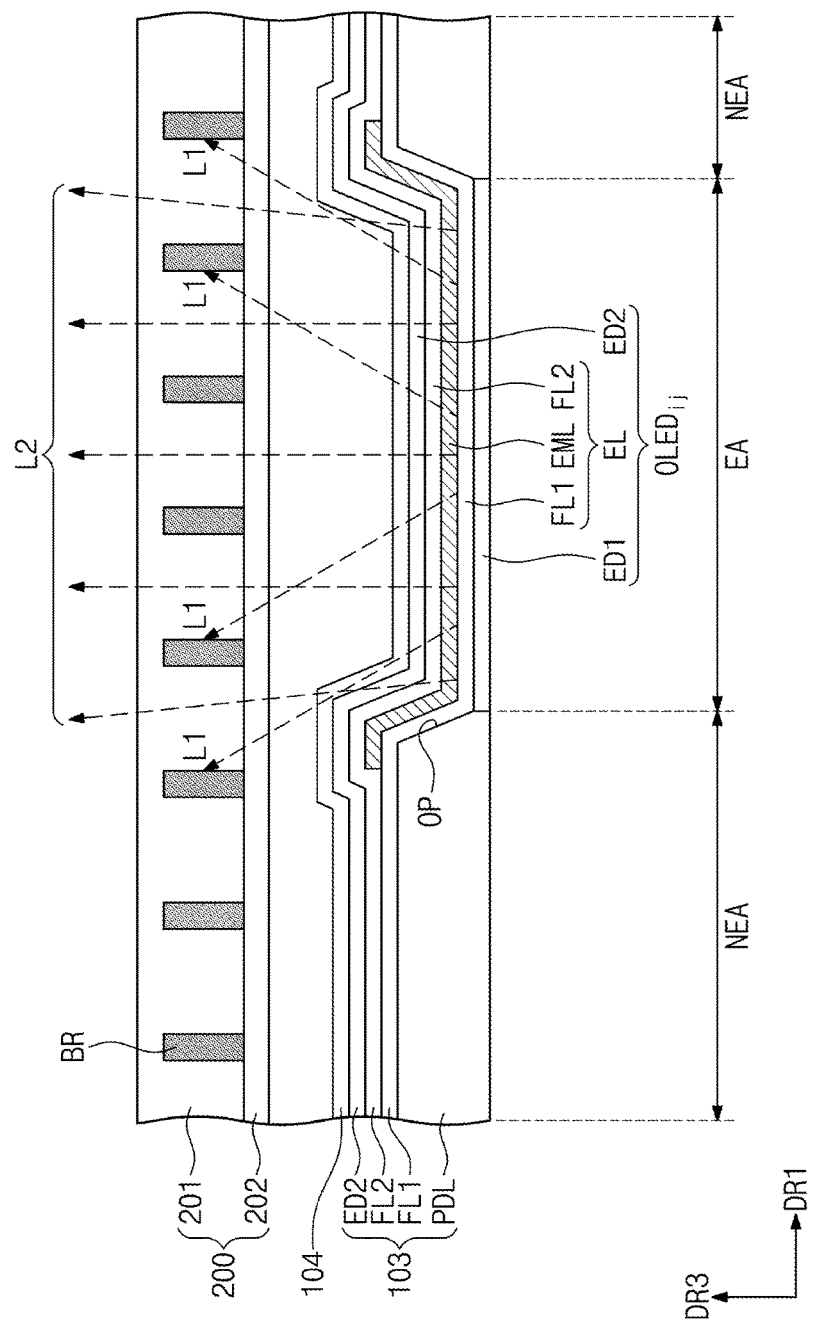

DISPLAY DEVICE AND METHOD FOR MANUFACTURING THE SAME

CROSS-REFERENCE TO RELATED APPLICATIONS

This U.S. non-provisional patent application claims priority under 35 U.S.C. § 119 of Korean Patent Application No. 10-2016-0083655 filed on Jul. 1, 2016, the entire content of which is hereby incorporated by reference.

BACKGROUND

The present disclosure herein relates to a display device, and more particularly, to a display device and a method for manufacturing the same.

Various display devices such as smart phones, notebook computers, and smart televisions are being developed. Among them, in recent years, display devices mounted on vehicles are being utilized in various fields. For example, display devices for vehicles may receive real traffic information and Internet information to provide the received information to a user. Also, display devices for vehicles may provide services such as music, games, TV programs, and movies.

As described above, since various information and services are provided to the user through display devices for the vehicles, demands for display devices for vehicles are showing a rising trend.

However, in the use of such a display device for a vehicle, an image displayed from the display device may be seen on a windshield of the vehicle. This windshield display may be problematic because when the user drives a vehicle, the image may obstruct the user's field of vision.

SUMMARY

The present disclosure provides a display device in which light is emitted in a direction facing a display surface and a method for manufacturing the same.

An embodiment of the inventive concept provides a display device includes: a first substrate including a first base layer, a circuit layer disposed on the first base layer, and a light emitting layer disposed on the circuit layer; a second substrate including a top surface and a bottom surface and in which a plurality of grooves arranged in a first are defined in the bottom surface, the second substrate being disposed on the first substrate; and a plurality of light blocking members disposed on the plurality of grooves to control propagation direction of light outputted from the light emitting layer.

In an embodiment, the second substrate may include: a second base layer in which the plurality of grooves are defined; and a protection layer disposed on the second base layer to cover the plurality of grooves.

In an embodiment, the first substrate includes a display area and a non-display area that surround the display area, a plurality of emission areas and a plurality of non-emission areas that are adjacent to the plurality of emission areas may be defined on the display area, and the plurality of grooves may overlap the display area and not overlap the non-display area.

In an embodiment, one of the plurality of grooves crosses at least two adjacent emission areas among the plurality of emission areas.

In an embodiment, the display device may further include a sealing member configured to couple the first substrate to the second substrate, wherein the sealing member may overlap the non-display area.

In an embodiment, the display device may further include a touch sensing unit disposed on the second base layer.

In an embodiment, each of the plurality of grooves may have a first side surface, a second side surface, and a bottom surface configured to connect the first and second side surfaces to each other, and the first side surface and the second side surface may be parallel to a thickness direction of the second substrate.

In an embodiment, each of the plurality of grooves may have a width of about 5 micro meters to about 20 micro meters in the first direction and a depth of about 100 micro meters to about 500 micro meters in the thickness direction.

In an embodiment, the plurality of grooves are arranged with a uniform distance therebetween, from the distance being between about 30 micro meters to about 150 micro meters.

In an embodiment, each of the plurality of grooves may have a first side surface, a second side surface, and a bottom surface configured to connect the first and second side surfaces to each other, and the first side surface and the second side surface may be inclined at a predetermined angle from a thickness direction of the second substrate to a direction that is parallel to the bottom surface.

In an embodiment, the light blocking member may include a black resin.

In an embodiment of the inventive concept, a display device includes: a display panel on which a display area and a non-display area configured to surround the display area are defined; a window member including a top surface and a bottom surface and in which a plurality of grooves arranged in a first direction are defined in the bottom surface, the window member being disposed on the display panel to allow the bottom surface to face the display panel; and a light blocking member disposed in each of the plurality of grooves, wherein the plurality of grooves are disposed in the display area.

In an embodiment, the window member may include: a base layer on which the top surface and the bottom surface are defined; and a bezel layer overlapping the non-display area and disposed on the bottom surface.

In an embodiment, a plurality of emission areas and a plurality of non-emission areas that are adjacent to the plurality of emission areas may be defined on the display area, and the plurality of grooves are in the display area and outside the non-display area.

In an embodiment, the display device may further include a touch sensing unit disposed between the display panel and the window member, wherein the window member may include a protection layer disposed on the bottom surface to cover the plurality of grooves.

In an embodiment of the inventive concept, a method for manufacturing a display device includes: preparing a lower substrate including a first base layer, a circuit layer disposed on the first base layer, and a light emitting layer disposed on the circuit layer; preparing an upper substrate including a plurality of grooves formed in a bottom surface of the upper substrate, arranged in a first direction and a light blocking member disposed in the grooves; and disposing the upper substrate on the lower substrate.

In an embodiment, a display area and a non-display area may be defined on the lower substrate, and the method may further include coupling the bottom surface of the upper substrate to the lower substrate by using a sealing member overlapping the non-display area.

In an embodiment, the method may further include disposing a touch sensing unit on the upper substrate.

In an embodiment, the method may further include: disposing an encapsulation substrate on the lower substrate; and coupling the encapsulation substrate to the upper substrate by using an adhesion layer.

In an embodiment, the method may further include disposing a touch sensing unit on the encapsulation substrate, wherein the upper substrate may be disposed on the touch sensing unit.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 3B is a partial plan view of the display panel of FIG. 3A;

FIG. 6 is a partial cross-sectional view of the display panel in which a traveling direction of light outputted from an emission area of FIG. 4 is illustrated;

DETAILED DESCRIPTION

Figure 1:
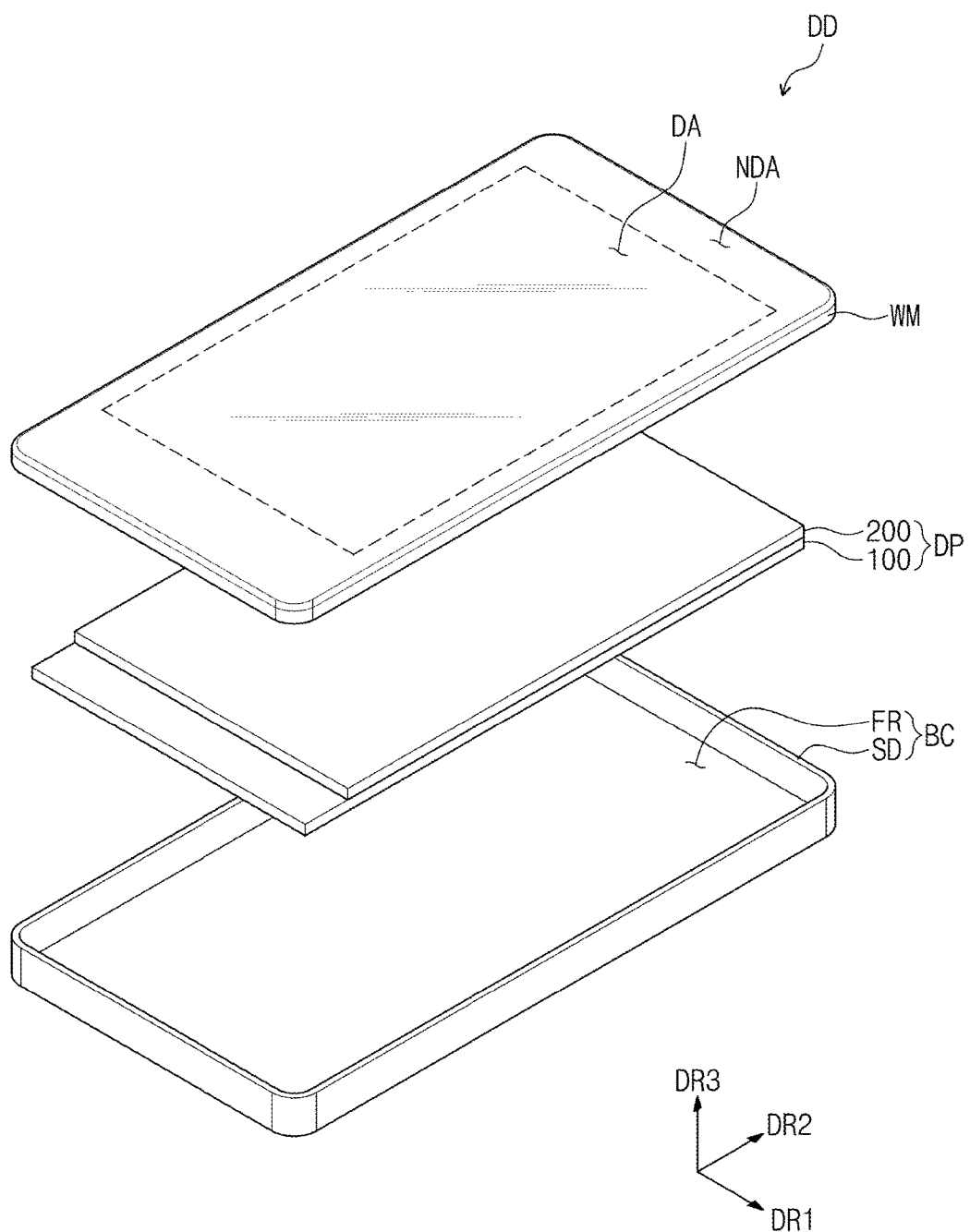
FIG. 1 is an exploded perspective view of a display device according to an embodiment of the inventive concept.

Hereinafter, embodiments of the inventive concept will be described with reference to the accompanying drawings. In this specification, it will also be understood that when one component (or region, layer, portion) is referred to as being 'on', 'connected to', or 'coupled to' another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration. The term "and/or" includes any and all combinations of one or more of the associated listed items.

It will be understood that although the terms of first and second are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under", "below", "above', "upper", and the like are used for explaining relation association of components illustrated in the drawings. The terms may be a relative concept and described based on directions expressed in the drawings.

The meaning of 'include' or 'comprise' specifies a property, a fixed number, a step, an operation, an element, a component or a combination thereof, but does not exclude other properties, fixed numbers, steps, operations, elements, components or combinations thereof.

Figure 2A:
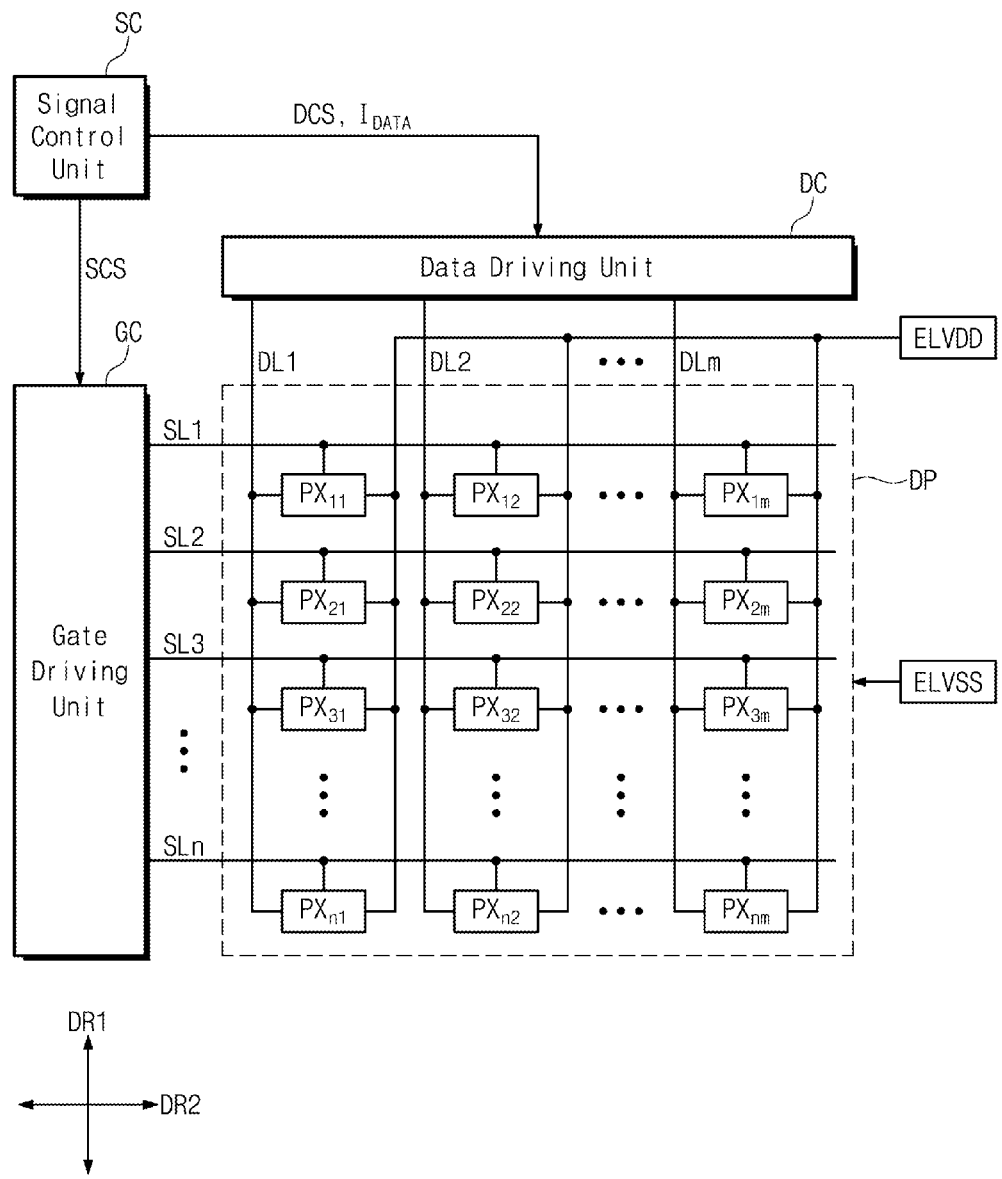
FIG. 2A is a block diagram of the display apparatus according to an embodiment of the inventive concept.
Figure 2B:
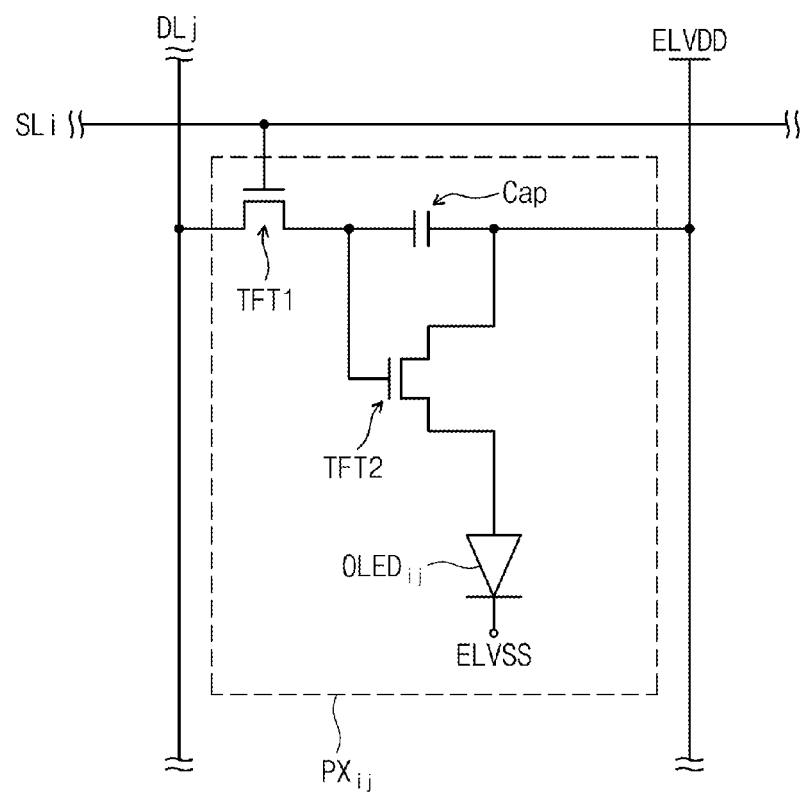
FIG. 2B is an equivalent circuit view of a pixel of FIG. 2A.

FIG. 1 is an exploded perspective view of a display device according to an embodiment of the inventive concept. FIG. 2A is a block diagram of the display apparatus according to an embodiment of the inventive concept. FIG. 2B is an equivalent circuit view of a pixel of FIG. 2A.

According to an embodiment of the inventive concept, a display device DD of FIG. 1 may be applied to tablet PCs, smart phones, personal digital assistants (PDAs), portable multimedia players (PMPs), game consoles, watches, electronic devices, and the like. Also, the display device DD may be applied to electronic equipment such as televisions or external billboards as well as small and middle electronic equipment such as personal computers, notebook computers, navigation units for vehicles, and cameras.

Particularly, the display device DD according to an embodiment of the inventive concept may be mounted in transport means such as vehicles, airplanes, and ships. The above-described equipment are exemplified as merely an exemplary embodiment, and thus, the display device DD may be adopted for other electronic equipment unless departing from the spirit and scope of the disclosed concept.

The display device DD includes a plurality of areas divided on a display surface. Here, the display surface may be one surface of the display device on which an image is directly seen by a user. The display device DD includes a display area DA on which an image is displayed and a non-display area NDA that is adjacent to the display area DA. The non-display area NDA may surround the display area DA.

Referring to FIG. 1, the display device DD may include a window member WM, a display panel DP, and an accommodating member BC.

The window member WM may be disposed above the display panel DP to transmit an image provided from the display panel DP through the display area DA. For example, the window member may include glass, sapphire, plastic, and the like.

As illustrated in FIG. 1, although the window member WM is illustrated as a single layer, the window member WM may include a plurality of layers. For example, the window member WM may include a base layer and at least one bezel layer disposed on a bottom surface of the base layer to correspond to the non-display area NDA.

The display panel DP is parallel to a surface that is defined by a first direction DR1 and a second direction DR2. A normal direction of the display panel DP is indicated in a third direction DR3. The third direction DR3 indicates a thickness direction of the display device DD. A top surface (a front surface) and a bottom surface (a rear surface) of each of the members are divided by the third direction DR3. However, directions indicated as the directions DR1, DR2, and DR3 may be a relative concept and the exact direction may vary.

In detail, the display panel DP may include a first substrate 100 and a second substrate 200 disposed between the window member WM and the first substrate 100.

The first substrate 100 may include a plurality of pixels, a plurality of organic light emitting devices, and a plurality of signal lines that are required for driving the display device DD. For example, the signal lines include a plurality of gate lines extending in the second direction DR2 and arranged in the first direction DR1. For example, the signal lines may include a plurality of data lines extending in the first direction DR1 and arranged in the second direction DR2. The gate lines and the data lines may be insulated from each other and cross each other.

However, the technical ideas of the inventive concept are not limited to what is explicitly disclosed. For example, the gate lines may extend in the first direction DR1 and be arranged in the second direction DR2. Also, the data lines may extend in the second direction DR2 and be arranged in the first direction DR1.

The second substrate 200 is disposed on the first substrate 100 to seal organic light emitting devices contained in the first substrate 100 against the outside. For example, the second substrate 200 may be an encapsulation substrate.

According to an embodiment of the inventive concept, a plurality of grooves arranged in the first direction and extending in the third direction perpendicular to the first direction may be defined in a bottom surface of the second substrate 200. Here, the bottom surface of the second substrate 200 may be a surface facing the first substrate 100.

Also, a light blocking member may be disposed in each of the plurality of grooves. For example, the light blocking member may be a resin having a black color, but is not limited thereto. The light blocking member may be formed of a material having various colors for blocking the traveling of light. The traveling direction of the light provided from the first substrate 100 may be controlled by the grooves defined in the bottom surface of the substrate 200. This will be described in more detail with reference to FIG. 4.

According to an embodiment of the inventive concept, the display panel DP may be a liquid crystal display panel, an organic light emitting display panel, an electrophoretic display panel, or an electrowetting display panel. Here, the embodiment of the inventive concept is not limited to a kind of display panels. Hereinafter, in the descriptions of the inventive concept, the organic light emitting display panel will be described as an example.

The accommodating member BC is coupled to the window member WM to accommodate the display panel DP. The accommodating member BC may be formed by assembling a plurality of parts or include one body that is injection-molded. The accommodating member BC may include plastic or a metal. The accommodating member BC may include a bottom part FR in which the display panel DP is accommodated and a plurality of sidewalls SD that are bent from the bottom part FR.

Although the display device DD is flat in FIG. 1, the display device DD according to an embodiment of the inventive concept may be flexible. That is, each of components such as the display panel DP and the window member WM of the display device DD may be formed of a flexible material and thus be bendable, stretchable, or compressible.

Referring to FIGS. 2A and 2B, a block diagram of the display device DD according to an embodiment of the inventive concept is illustrated. The display device DD includes a signal control unit TC, a gate driving unit GC, a data driving unit DC, and an organic light emitting display panel DP (hereinafter, referred to as a display panel).

The signal control unit SC receives input image signals and outputs image data IDATA that are converted to match an operation mode of the display panel DP, a gate control signal SCS, and a data control signal DCS.

The gate driving unit GC receives the gate control signal SCS from the signal control unit SC. The gate driving unit GC receiving the gate control signal SCS generates a plurality of gate signals. The gate driving unit GC successively supplies the gate signals to the display panel DP.

The data driving unit DC receives the data control signal DCS and the converted image data IDATA from the signal control unit SC. The data driving unit DC generates a plurality of data signals on the basis of the data control signal DCS and the converted image data IDATA. The data driving unit DC supplies data signals to the display panel DP.

The display panel DP receives an electrical signal from the outside to display an image. The display panel DP includes a plurality of gate lines SL1 to SLn, a plurality of data lines DL1 to DLm, and a plurality of pixels PX11 to PXnm.

The gate lines SL1 to SLn extend in the second direction DR2 and are arranged in the first direction DR1 crossing the second direction DR2. The gate lines SL1 to SLn successively supply gate signals from the gate driving unit GC.

The data lines DL1 to DLm are insulated from the gate lines SL1 to SLn and cross the gate lines SL1 to SLn. The data lines DL1 to DLm extend in the first direction DR1 and are arranged in the second direction DR2. The data lines DL1 to DLm receive data signals from the data driving unit DC.

The display panel DP receives a first power source voltage ELVDD and a second power source voltage ELVSS from the outside. Each of the pixels PX11 to PXnm is turned on in response to a corresponding gate signal of the gate signals. Each of the pixels PX11 to PXnm receives the first power source voltage ELVDD and the second power source voltage ELVSS to generate light in response to a corresponding data signal of the data signals. The first power source voltage ELVDD may have a level higher than that of the second power source voltage ELVSS. The pixels PX11 to PXnm may be arranged in the form of a matrix. The pixels PX11 to PXnm are connected to corresponding gate lines of the gate lines SL1 to SLn and corresponding data lines of the data lines DL1 to DLm.

Each of the pixels PX11 to PXnm receives a gate signal from a corresponding gate line of the gate lines SL1 to SLn and a data signal from a corresponding data line of the data lines DL1 to DLm. Each of the pixels PX11 to PXnm may be turned on in response to a corresponding gate signal to generate light in response to a corresponding data signal, thereby displaying an image.

Also, each of the pixels PX11 to PXnm according to an embodiment of the inventive concept includes at least one transistor, at least one capacitor, and an organic light emitting device. FIG. 2B illustrates an equivalent circuit view illustrating an example of a pixel PXij connected to an i-th gate line SLi of the plurality of gate lines SL1 to SLn and a j-th data line of the plurality of data lines DL1 to DLm.

The pixel PXij includes a first thin film transistor TFT1, a second thin film transistor TFT2, a capacitor Cap, and an organic light emitting device OLEDij. The first thin film transistor TFT1 includes a control electrode connected to the i-th gate line SLi, an input electrode connected to the j-th data line DLj, and an output electrode. The first thin film transistor TFT1 outputs a data signal applied to the j-th data line DLj in response to the gate signal applied to the i-th gate line SLi.

The capacitor Cap includes a first capacitor electrode connected to the first thin film transistor TFT1 and a second capacitor electrode receiving a first power source voltage ELVDD. The capacitor Cap charges electrical charges by an amount corresponding to a difference between a voltage corresponding the data signal received from the first thin film transistor TFT1 and the first power source voltage ELVDD.

The second thin film transistor TFT2 includes a control electrode connected to the output electrode of the first thin film transistor TFT1 and the first capacitor electrode of the capacitor Cap, an input electrode receiving the first power source voltage ELVDD, and an output electrode. The output electrode of the second thin film transistor TFT2 is connected to the organic light emitting device OLEDij.

The second transistor TFT2 controls driving current flowing through the organic light emitting diode OLEDij to correspond to a charge amount stored in the capacitor Cap. A turn-on time of the second thin film transistor TFT2 is determined according to the amount of charge in the capacitor Cap. Substantially, the output electrode of the second thin film transistor TFT2 supplies a voltage having a level less than that of the first power source voltage ELVDD to the organic light emitting device OLEDij.

The organic light emitting device OLEDij includes a first electrode connected to the second thin film transistor TFT2 and a second electrode receiving the second power source voltage ELVSS. The organic light emitting device OLEDij may include a light emitting pattern disposed between the first and second electrodes.

The organic light emitting device OLEDij emits light in the turn-on period of the second thin film transistor TFT2. The light generated in the organic light emitting device OLEDij may have a color that is determined by a material for forming the light emitting pattern. For example, the light generated in the organic light emitting device OLEDij may have one of a red color, a green color, a blue color, and a white color.

Figure 3A:
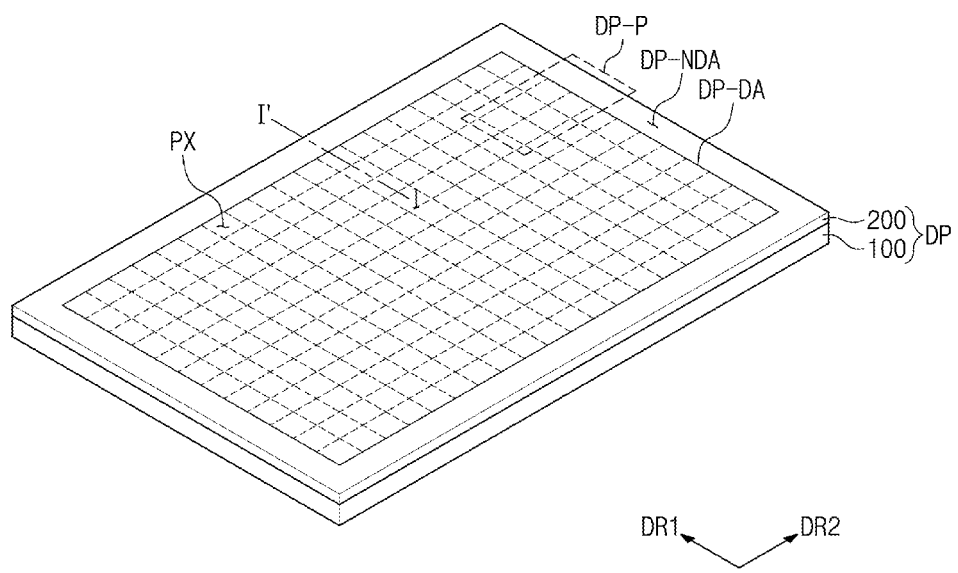
FIG. 3A is a plan view of a display panel of FIG. 1.

FIG. 3A is a plan view of the display panel of FIG. 1. FIG. 3B is a partial plan view of the display panel of FIG. 3A.

Referring to FIG. 3A, the display panel DP may include a display area DP-DA and a non-display area DP-NDA on a plane. The display area DP-DA and the non-display area DP-NDA may be changed according to a structure/design of the display panel DP.

As described above, the display panel DP includes a first substrate 100 and a second substrate 200. The first substrate 100 includes a plurality of pixels PX overlapping the display area DP-DA. Although the pixels PX arranged in the form of a matrix is illustrated, the embodiment of the inventive concept is not limited thereto. The pixels PX may be arranged in the form of a non-matrix, e.g., the form of a pantile.

Referring to FIG. 3B, the display area DP-DA is defined as a plurality of emission area EA-R, EA-G, and EA-B and a non-emission area NEA on a plane that is defined by the first direction DR1 and the second direction DR2. FIG. 3 illustrates an example of three types of emission areas EA-R, EA-G, and EA-B that are arranged in the form of the matrix. Organic light emitting devices that emit light having three colors different from each other may be disposed on the three types of emission areas EA-R, EA-G, and EA-B, respectively.

According to another embodiment of the inventive concept, organic light emitting devices emitting white colors may be disposed on the three types of emission areas EA-R, EA-G, and EA-B, respectively. Here, three types of color filters having colors different from each other may overlap the three types of emission areas EA-R, EA-G, and EA-B, respectively.

According to the descriptions of the inventive concept, a feature in which "light having a predetermined color is emitted from the emission area" may include a case in which light generated in the light emitting device is emitted as it is as well as a case in which light generated in the corresponding light emitting device is converted in color and then emitted.

Although not shown, according to another embodiment of the inventive concept, the plurality of emission areas EA-R, EA-G, and EA-B may include four or more types of emission areas.

The non-emission area NEA may be divided into first non-emission areas NEA-1 surrounding the emission areas EA-R, EA-G, and EA-B and a second non-emission area NEA-2 defining a boundary between the first non-emission areas NEA-1. A driving circuit of the pixel, e.g., the thin film transistors TFT1 and TFT2 (see FIG. 2B) or the capacitor Cap (see FIG. 2B) may be disposed on each of the first non-emission areas NEA-1. Signal lines, e.g., the gate lines SLi (see FIG. 2B) and the data line DLj (see FIG. 2B) may be disposed on the second non-emission area NEA-2. However, the embodiment of the inventive concept is not limited thereto. For example, the first non-emission areas NEA-1 and the second non-emission area NPXA-2 may not be divided with respect to each other.

Also, although not shown, according to another embodiment of the inventive concept, each of the emission areas EA-R, EA-G, and EA-B may have a shape similar to a diamond-shape. According to an embodiment of the inventive concept, the organic light emitting devices that emit light having the four colors different from each other may be disposed on the four types of emission areas that are repeatedly disposed, respectively.

According to an embodiment of the inventive concept, a plurality of light blocking members BR arranged in the first direction DR1 and extending in the second direction DR2 perpendicular to the first direction DR1 may be disposed on the display panel DP. The light blocking members BR may be disposed in a plurality of grooves defined in a bottom surface DS of the second substrate 200. The light blocking members BR may control the propagation direction of the light outputted from the emission areas EA-R, EA-G, and EA-B.

According to an embodiment of the inventive concept, one of the plurality of grooves crosses at least two adjacent emission areas among the plurality of emission areas.

In detail, when the light emitted from the emission areas EA-R, EA-G, and EA-B are transmitted to the light blocking members BR, the light blocking members BR may absorb the transmitted light. The light blocking members BR may be formed of a resin having a black color to absorb the light transmitted from the emission areas EA-R, EA-G, and EA-B. However, the technical ideas of the inventive concept are not limited thereto. For example, the blocking members BR may be formed of various materials having various colors that are capable of absorbing the light.

That is, a portion of the light outputted from the emission areas EA-R, EA-G, and EA-B may be absorbed by the light blocking members BR, and the other portion of the light may be outputted to the outside of the display panel DP. That is, light of the light outputted from the emission areas EA-R, EA-G, and EA-B, which passes between the light blocking members BR, may be outputted to the outside through the display surface.

Thus, the propagation direction of the light outputted through the display surface may be controlled based on the shape of each of the grooves defined in the bottom surface DS.

For example, the display device may be mounted in a vehicle. In this case, the display device may be disposed inside the vehicle so that the display surface is seen by the user. In case of the existing display device, the light outputted from the emission areas EA-R, EA-G, and EA-B may be outputted in various directions through the display surface and thus be seen or reflected on a windshield of the vehicle.

According to an embodiment of the inventive concept, the light outputted from the emission areas EA-R, EA-G, and EA-B may be outputted through the display surface in a predetermined direction by the light blocking members BR. As a result, it may prevent an image from being seen on the windshield of the vehicle.

Figure 4:
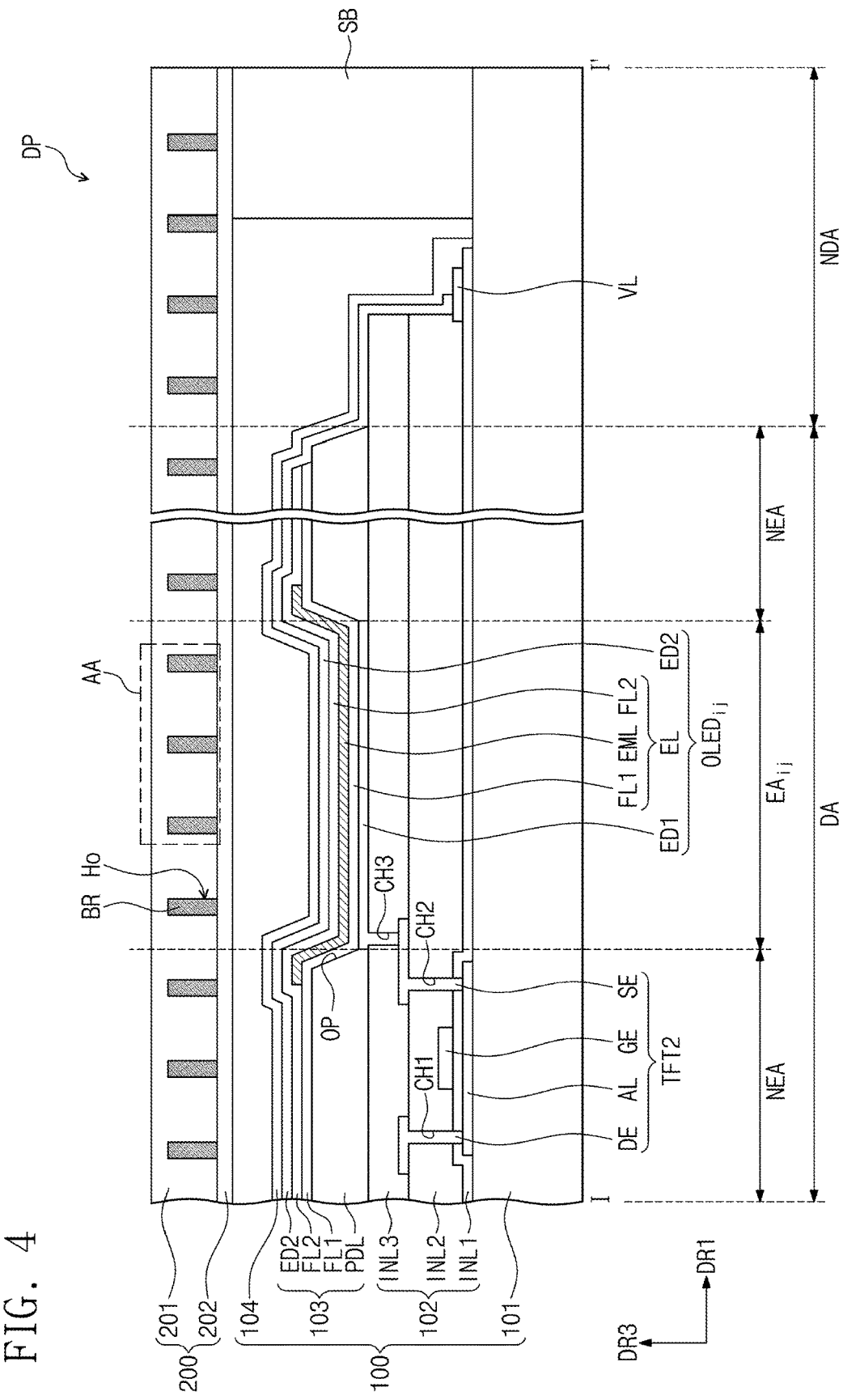
FIG. 4 is a cross-sectional view taken along line I-I' of FIG. 3A.
Figure 5A:
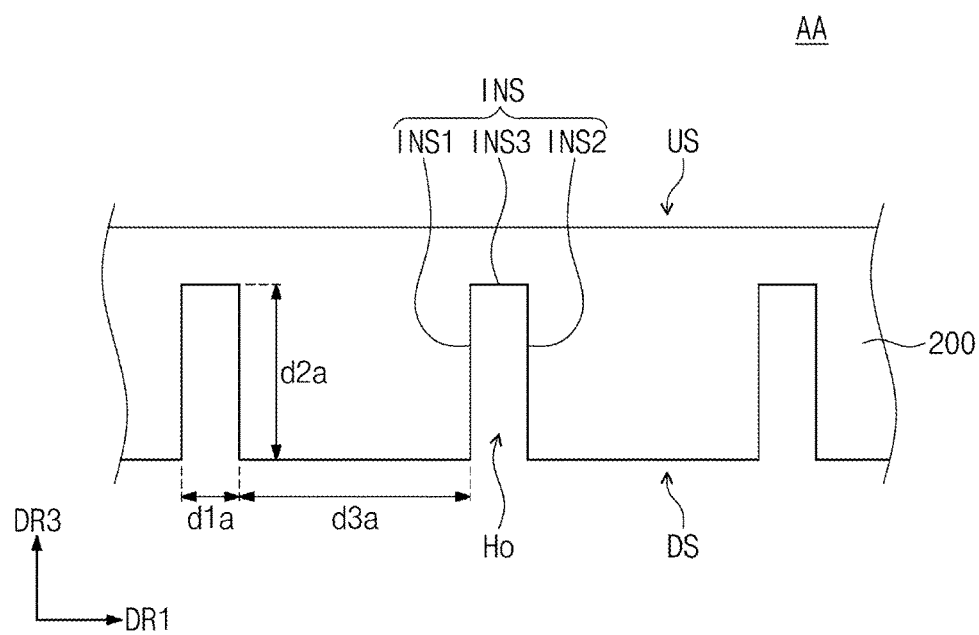
FIGS. 5A and 5B are enlarged views of an area AA of FIG. 4.
Figure 5B:
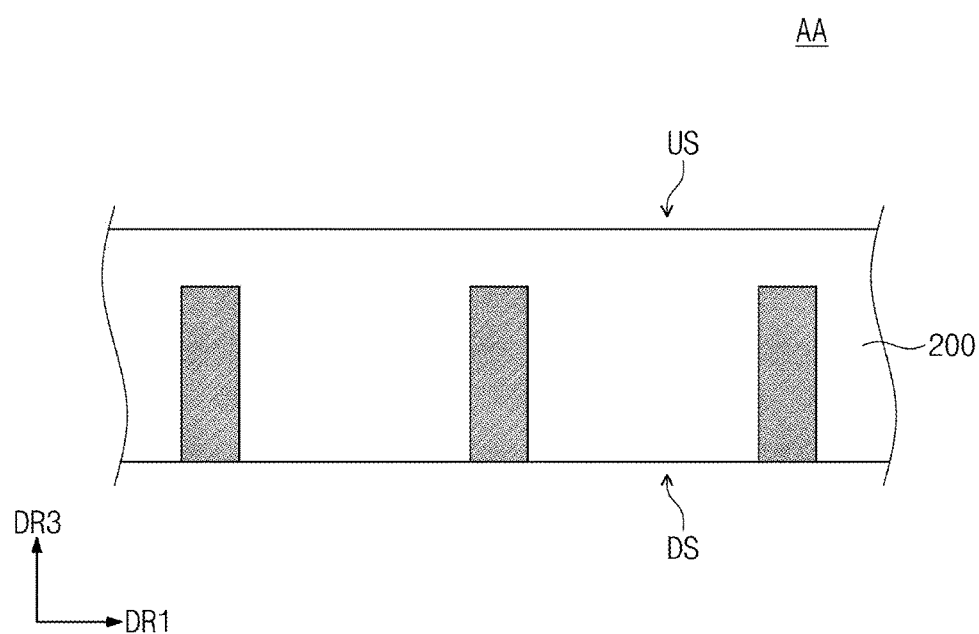

FIG. 4 is a cross-sectional view taken along line I-I' of FIG. 3A. FIGS. 5A and 5B are enlarged views of an area AA of FIG. 4.

Referring to FIG. 4, the first substrate 100 may include a first base layer 101, a circuit layer 102, a light emitting layer 103, and a cover layer 104. As shown, a display area DA and a non-display area NDA are defined on the first substrate 100. The "display area" DA, as used herein, refers not just to specific portions of the first substrate 100 but also an area overlapping the display area DA of the first substrate 100. Likewise, the "nondisplay area" NDA, as used herein, refers not just to specific portions of the first substrate 100 but also an area overlapping the nondisplay area NDA of the first substrate 100.

The first base layer 101 may have a rectangular shape on the plane. However, this shape may be merely an example. For example, the first base layer 101 may have various shapes. Also, the first base layer 101 may be an insulation substrate. For example, the first base layer 101 may be a glass substrate or plastic substrate.

The circuit layer 102 is disposed on the first base layer 101. The circuit layer 102 may include a first thin film transistor TFT1, a capacitor Cap, a second thin film transistor TFT2, and a plurality of insulation layers. FIG. 4 is a view illustrating an example of an area on which the thin film transistor TFT2 of FIG. 2B is disposed.

The second thin film transistor TFT2 includes a semiconductor layer AL, a control electrode GE, and an input electrode DE and output electrode SE, which are electrically connected to the semiconductor layer AL.

The semiconductor layer AL is disposed on the first base layer 101. Although not shown, a buffer layer may be disposed between the first base layer 101 and the semiconductor layer AL. The buffer layer (not shown) may be an inorganic layer and/or organic layer. The buffer layer may prevent the semiconductor layer characteristics from deteriorating.

The semiconductor layer AL may include amorphous silicon (a-Si), polysilicon (poly-Si), an oxide semiconductor, or an organic semiconductor, but the present disclosure is not limited to a specific embodiment. Also, although not shown, the semiconductor layer AL may be divided into a source region, a drain region, and a channel region defined between the source region and the drain region on the plane. The source region and the drain region may be regions in which impurities are doped. When a voltage is applied to the second thin film transistor TFT2, carriers existing in the source region and the drain region may move through the channel region.

The first insulation layer INL1 is disposed on the semiconductor layer AL. The first insulation layer INL1 insulates layers to be formed in the following process from the semiconductor layer AL. The first insulation layer INL1 includes an organic layer and/or an inorganic layer.

The control electrode GE is disposed on the first insulation layer INL1. As described above, the control electrode GE is connected to the output electrode of the first thin film transistor TFT1 (see FIG. 2B).

The control electrode GE turns the second thin film transistor TFT2 on/off to receive a signal. The control electrode GE is disposed to correspond to the channel region. The control electrode GE may include a conductive metal, a conductive semiconductor, or a conductive polymer.

Although not shown, the gate lines SL1 to SLn (see FIG. 2A) may be disposed on the first insulation layer INL1. The gate lines SL1 to SLn may be formed at the same process as that of the control electrode GE.

The second insulation layer INL2 is disposed on the first insulation layer INL1. The second insulation layer INL2 electrically insulates the control electrode GE and the gate lines SL1 to SLn from other components.

An input electrode DE and an output electrode SE are disposed to be spaced apart from each other on the second insulation layer INL2. The input electrode DE and the output electrode SE may be connected to the semiconductor layer Al through first and second contact hole CH1 and CH2, which respectively pass through the first and second insulation layer INL1 and INL2.

Although not shown, the data lines DL1 to DLm (see FIG. 2A) may be disposed on the second insulation layer INL2. The data lines DL1 to DLm may be formed in the same process as those of the input electrode DE and the output electrode SE at the same time.

A third insulation layer INL3 is disposed on the second insulation layer INL2. The third insulation layer INL3 electrically insulates the input electrode DE, the output electrode SE, and the data lines DL1 to DLm from other components.

The light emitting layer 103 may be disposed on the circuit layer 102 and include a first electrode ED1, an organic layer EL, and a second electrode ED2.

The first electrode ED1 may be disposed on the third insulation layer INL3 to overlap the emission area EA. The first electrode ED1 may be a pixel electrode or an anode electrode. The first electrode ED1 may be formed of a material having a high work function so that holes are easily injected. Also, the first electrode ED1 may be formed of a conductive material. The first electrode ED1 may be a reflective electrode, a transmissive electrode, or a transflective electrode. For example, the first electrode ED1 may be provided as a single layer or a multi layer.

A pixel defining layer PDL may be disposed on the third insulation layer INL3, and the pixel defining layer PDL may overlap the non-emission area NEA. For example, the pixel defining layer PDL may be an insulation layer. An opening OP may be defined in the pixel defining layer PDL. The opening OP of the pixel defining layer PDL exposes the first electrode ED1 overlapping the emission area EA. Openings OP-R, OP-G, and OP-B of FIG. 3B may correspond to the opening OP of the pixel defining layer PDL.

The organic layer EL is disposed on the first electrode ED1. The organic layer EL includes light emitting patterns, a hole transport region FL1 (or a hole control layer), and an electron transport region FL2 (or an electron control layer). One light emitting pattern EML is illustrated in FIG. 4.

Each of the light emitting patterns EML is disposed on the emission area EA. The light emitting pattern EML receives an electrical signal to generate light.

The light emitting pattern EML may be formed of at least one material of materials that emit light having red, green, and blue colors and include fluorescent material or a phosphorescent material. Also, the light emitting pattern EML may include a host material and a dopant material. The host and the dopant may include a host and dopant, which are well known, respectively.

The hole transport region FL1 may be a region via which the holes injected from the first electrode ED1 reach the light emitting pattern EML. The hole transport region FL1 may include at least one of a hole injection layer, a hole transport layer, or a single layer having a hole injection function and a hole transport function.

The hole transport region FL1 may be formed of at least one of the hole injection material or the hole transport material. Each of the hole injection material and the hole transporting material may be a well-known material.

The hole transport region FL1 may further include a hole stop layer. When the hole transport region FL1 includes the hole stop layer, the hole transport region FL1 may include a hole stop material that is well known.

The hole transport region FL1 may further include a charge generating material. The charge generating material may be uniformly dispersed within the hole transport region FL1 to form one single region or non-uniformly dispersed to divide the hole transport region FL1 into a plurality of regions.

The electron transport region FL2 is defined between the light emitting pattern EML and the second electrode ED2. The electron transport region FL2 may be a region via which the electrons injected from the second electrode ED2 reach the light emitting pattern EML.

The electron transport region FL2 may include at least one of a hole stop layer, an electron transport layer, or an electron injection layer, but is not limited thereto. For example, the electron transport region FL2 may have a structure of the electron transport layer/the electron injection layer or the hole stop layer/the electron transport layer/the electron injection layer, which are successively laminated from the light emitting pattern EML. For example, the electron transport region FL2 may have a single layer structure in which at least two layers of the above-described layers are combined, but is not limited thereto.

The electron transport region FL2 may include at least one of an electron transport material or an electron injection material. Each of the electron injection material and the electron transporting material may be a well-known material.

The second electrode ED2 is disposed on the organic layer EL to face the first electrode ED1. The second electrode ED2 receives a second power source voltage ELVSS. When the first electrode ED1 is an anode electrode, the second electrode ED2 may be a cathode electrode. Thus, the second electrode ED2 may be formed of a material having a low work function so that electrons are easily injected.

The second electrode ED2 includes a conductive material. The conductive material may be a metal, an alloy, an electrical conductive compound, and a mixture thereof. The second electrode ED2 may include at least one of a reflective material or a transmissive material. Also, the second electrode ED2 may be a single layer or a multi layer. The multi layer may include at least one of a layer formed of the reflective material or a layer formed of the transmissive material.

The second electrode ED2 may be a reflective electrode, a transflective electrode, or a transmissive electrode. The second electrode ED2 is not limited to a specific embodiment. For example, the second electrode ED2 may be formed of various materials according to the structure of the organic light emitting device OLED.

The second electrode ED2 overlaps the emission area EA and the non-emission area NEA. As a result, the second electrode ED2 overlaps each of the first electrode ED1 and the pixel defining layer PDL. For example, the second electrode ED2 may cover an entire surface of the display area DA.

The second electrode ED2 is electrically connected to a power line VL to receive the second power source voltage ELVSS. A portion of the second electrode ED2 extends to the non-display area NDA and is directly connected to the power line VL.

However, the above-described structure may be merely an example, and thus, the connection between the second electrode ED2 and the power line VL may be variously deformed. For example, although not shown, the second electrode ED2 may be electrically connected to the power line VL through a separate contact electrode.

The cover layer 104 is disposed on the light emitting layer 103. The cover layer 104 is disposed on the second electrode ED2 to insulate the second electrode ED2 from other components disposed on the second electrode ED2. Also, the cover layer 104 prevents moisture and oxygen from being permeated into the organic light emitting device OLED.

The cover layer 104 may have non-conductivity. The cover layer 104 may be provided as at least one layer. The cover layer 104 includes at least one of an inorganic layer or an organic layer.

The cover layer 104 overlaps the emission area EA and the non-emission area NEA. The cover layer 104 may have the same shape as the second electrode ED2 and cover an entire surface of the second electrode ED2.

The second substrate 200 includes a second base layer 201 and a protection layer 202 disposed on the second base layer 201. The second base layer 201 may be a transparent insulation substrate. For example, the second base layer 201 may be a glass substrate or plastic substrate. Also, although not shown, when the display device includes the touch sensing unit, the second substrate 200 may be provided as an encapsulation substrate.

Also, as illustrated in FIG. 1, the second base layer 201 may expose at least a portion of the first base layer 101. The data driving unit DC (see FIG. 2A) and/or the gate driving unit GC (see FIG. 2A) may be disposed on the exposed area of the second base layer 101. However, the embodiment of the inventive concept is not limited to the shape of the second base layer 201. For example, the second base layer 201 may have the same shape as the first base layer 101.

Referring to FIGS. 5A and 5B, the protection layer 200 disposed on the second substrate 200 is omitted. That is, the second substrate 200 may be substantially the same as the second base layer 201.

In detail, the second substrate 200 may include a top surface US and a bottom surface DS. The top surface US may face the bottom surface DS in the third direction DR3, and the bottom surface DS may face the first substrate 100 in the third direction DR3.

According to an embodiment of the inventive concept, a plurality of grooves Ho arranged in the first direction DR1 and extending in the third direction DR3 may be defined in the bottom surface DS. Each of the grooves Ho may have a width having a first length d1a in the first direction DR1. Each of the grooves Ho may have a thickness having a second length d2a in the third direction DR3. Also, a distance between the grooves Ho may have a third length d3a in the first direction DR1.

According to an embodiment of the inventive concept, the first length d1a may be about 5 micro meters to about 20 micro meters, the second length d2a may be about 100 micro meters to about 500 micro meters, and the third length d3a may be about 30 micro meters to about 150 micro meters. However, the technical ideas of the inventive concept are not limited thereto. For example, the grooves Ho defined in the bottom surface DS may be variously defined according to the positions of the component of the display device DD.

Also, an inner side surface INS defining the grooves Ho includes a first side surface INS1 and a second side surface INS2, which interface each other in the first direction DR1. In this case, the first side surface INS1 and the second side surface INS2 may be parallel to each other in the third direction DR3. Also, the inner side surface INS may include a bottom surface INS3 connecting the first side surface INS1 to the second side surface INS2.

According to the descriptions of the inventive concept, although the inner side surface INS includes the three inner side surfaces, the technical ideas of the inventive concept are not limited thereto. For example, the inner side surface INS may include at least two or more inner side surfaces.

The light blocking member BR may be disposed on each of the grooves Ho. That is, the light blocking member BR may be disposed on the inner side surface INS. In the particular case that is depicted, the grooves Ho may be filled with the light blocking member BR.

Referring to FIG. 4, the protection layer 202 may be disposed on the bottom surface DS to cover the grooves Ho. The protection layer 202 may prevent the light blocking member BR from leaking from the grooves Ho. For example, the protection layer 202 may be provided as an organic layer coating layer or a film.

The sealing member SB may overlap the non-display area NDA and be disposed between the first substrate 100 and the second substrate 200. The sealing member SB may couple the first substrate 100 to the second substrate 200. Here, the sealing member SB may be a sealing material. Also, although not shown, a predetermined space between the first and second substrates 100 and 200 may be filled with a filling material.

FIG. 6 is a partial cross-sectional view of the display panel in which a direction in which light outputted from an emission area of FIG. 4 travels or propagates is illustrated.

Referring to FIG. 6, light outputted from the light emitting pattern EML disposed on the light emitting area EA may be outputted along the third direction DR3. Hereinafter, the light outputted from the light emitting pattern EML may be defined as output light. The output light may not be outputted in only a direction parallel to the third direction DR3, but be outputted in various directions.

Also, hereinafter, light transmitted from the light emitting pattern EML to the light blocking members BR may be defined as first light L1. Here, the first light L1 may represent light outputted from the light emitting pattern EML at a predetermined angle from the third direction DR3 to the first direction DR1. Also, light passing between the light blocking members BR from the light emitting pattern EML and then transmitted to the outside may be defined as second light L2. The second light L2 may represent light outputted from the light emitting pattern EML at a predetermined angle from the third direction DR3 to the first direction DR1.

As described above, the light blocking members BR may be arranged at a predetermined distance in the first direction DR1. When the first light L1 is outputted from the light emitting pattern EML, the first light L1 may be transmitted to the light blocking members BR. In this case, the first light L1 transmitted to the light blocking members BR may be absorbed by the light blocking members BR. That is, the first light L1 may be blocked by the light blocking members BR. As a result, the first light L1 may not be transmitted to the outside through the display surface.

On the other hand, when the second light L2 is outputted from the light emitting pattern EML, the second light L2 may be transmitted between the light blocking members BR. That is, the second light L2 may be transmitted to the outside through the display surface.

As described above, the direction in which the light outputted through the display surface of the display device DD travels may be controlled and made uniform by the light blocking members BR. That is, an image displayed through the display surface may not be seen from a direction/angle which does not face the display surface.

Figure 7A:
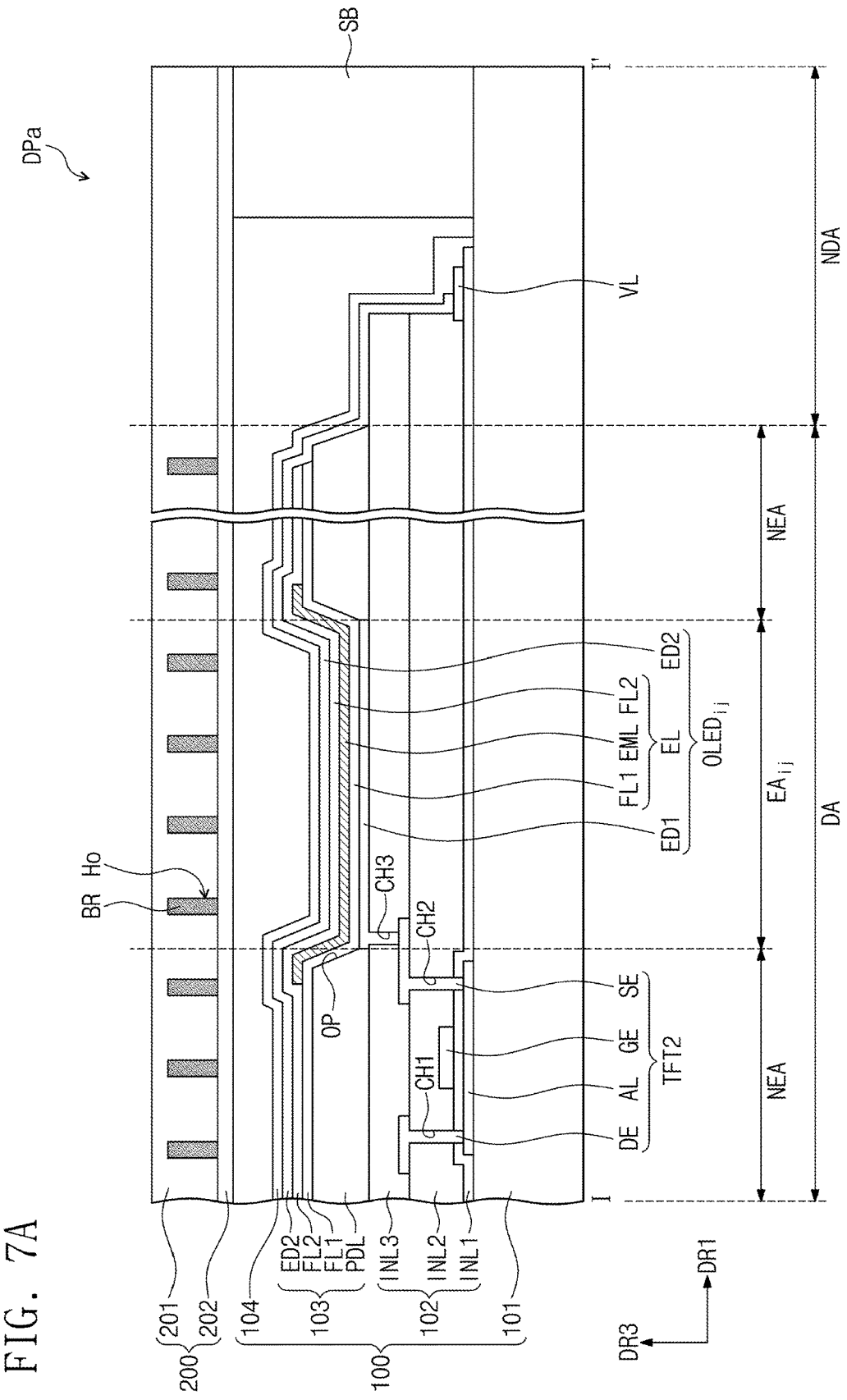
FIGS. 7A and 7B are cross-sectional views taken along line I-I' of FIG. 3A according to another embodiment of the inventive concept.
Figure 7B:
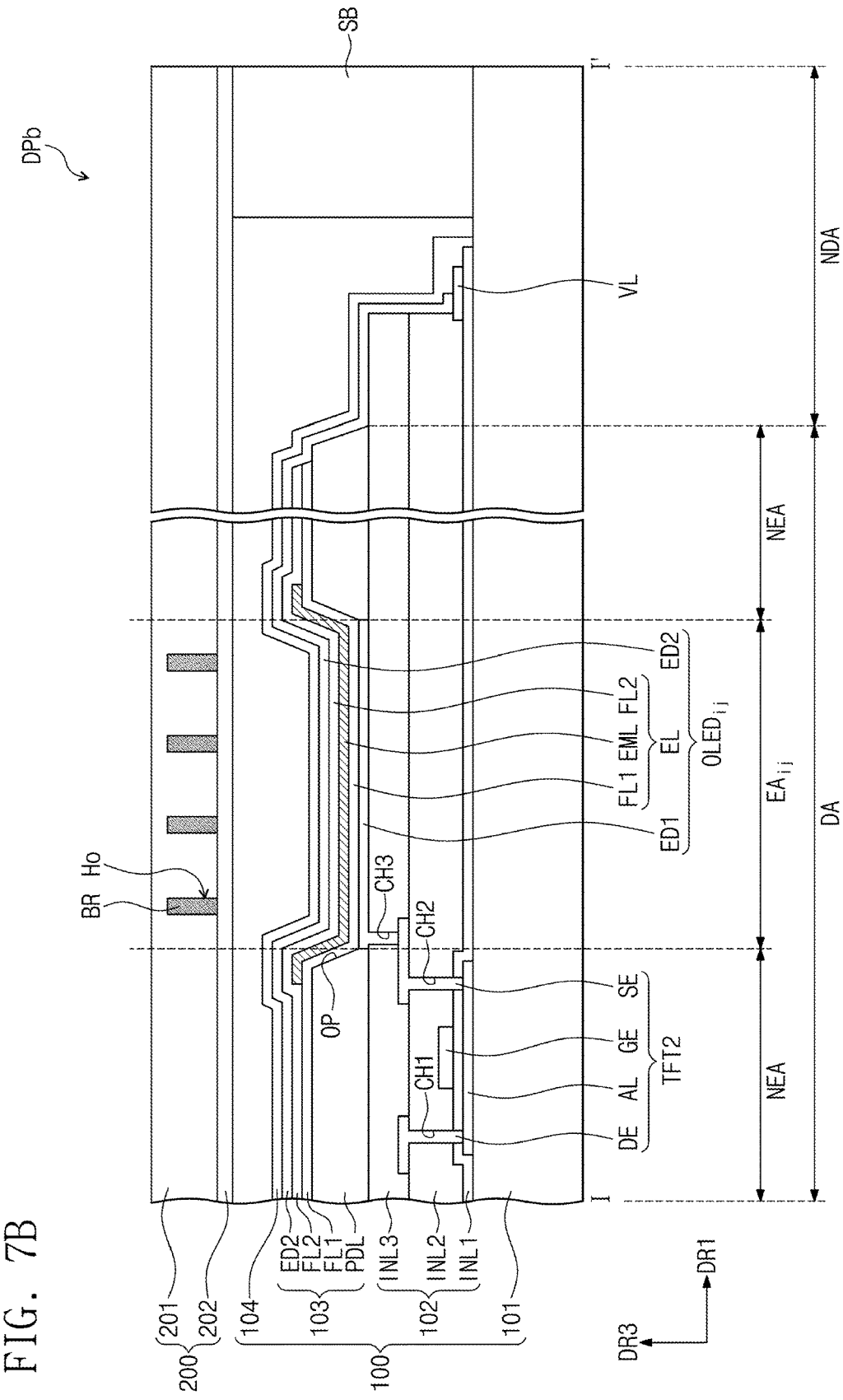

FIGS. 7A and 7B are cross-sectional views taken along line I-I' of FIG. 3A according to another embodiment of the inventive concept.

A display panel DPa of FIG. 7A and a display panel DPb of FIG. 7B may be substantially the same as the display panel DP of FIG. 4 except for only constituents of a second base layer 201. Thus, descriptions with respect to other constituents will be omitted.

Referring to FIG. 7A, a plurality of grooves Ho may be defined in the bottom surface DS of the second base layer 201. According to an embodiment of the inventive concept, the grooves Ho may be defined in the bottom surface DS of the second base layer 201 to overlap the display area DA. That is, grooves Ho may not overlap the non-display area NDA.

The light blocking member BR may be disposed on the grooves Ho. Similarly, the light blocking member BR may overlap the display area DA and do not overlap the non-display area NDA.

As described above, the display area DA may be divided into an emission area EA and a non-emission area NEA.

Referring to FIG. 7B, a plurality of grooves Ho may be defined in the bottom surface DS of the second base layer 201. According to an embodiment of the inventive concept, the grooves Ho defined in the bottom surface DS may not overlap the non-display area NDA and overlap the display area DA. Particularly, the grooves Ho may overlap the emission area EA of the display area DA and do not overlap the non-emission area NEA.

The light blocking member BR may be disposed on the grooves Ho. Similarly, the light blocking member BR may overlap the display area DA and do not overlap the non-display area NDA.

As described above, the grooves Ho may be defined in the bottom surface DS of the display panel in various manners.

Figure 8:
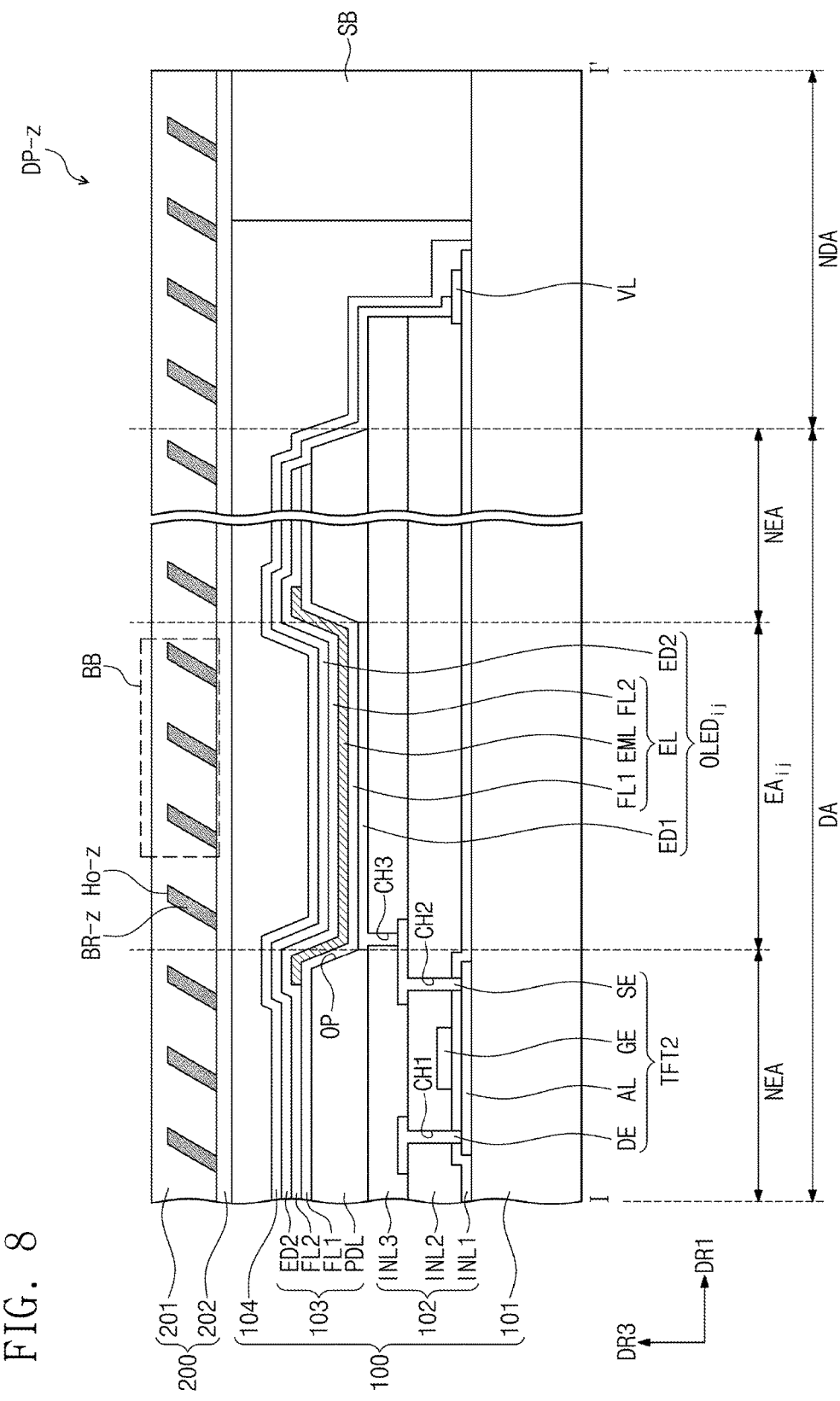
FIG. 8 is a cross-sectional view taken along line I-I' of FIG. 3A according to another embodiment of the inventive concept.
Figure 9A:
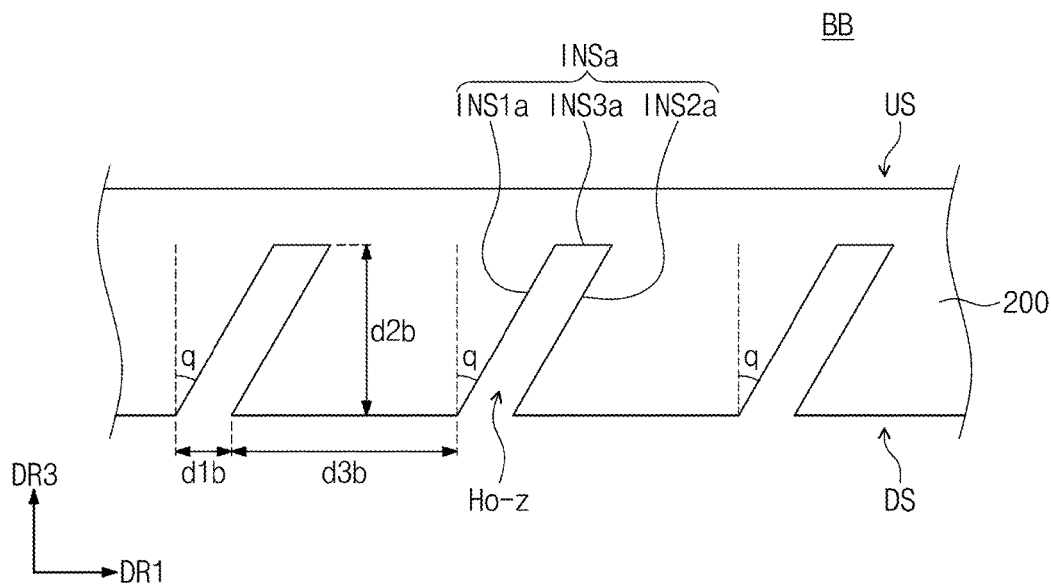
FIGS. 9A and 9B are enlarged views of an area BB of FIG. 8.
Figure 9B:
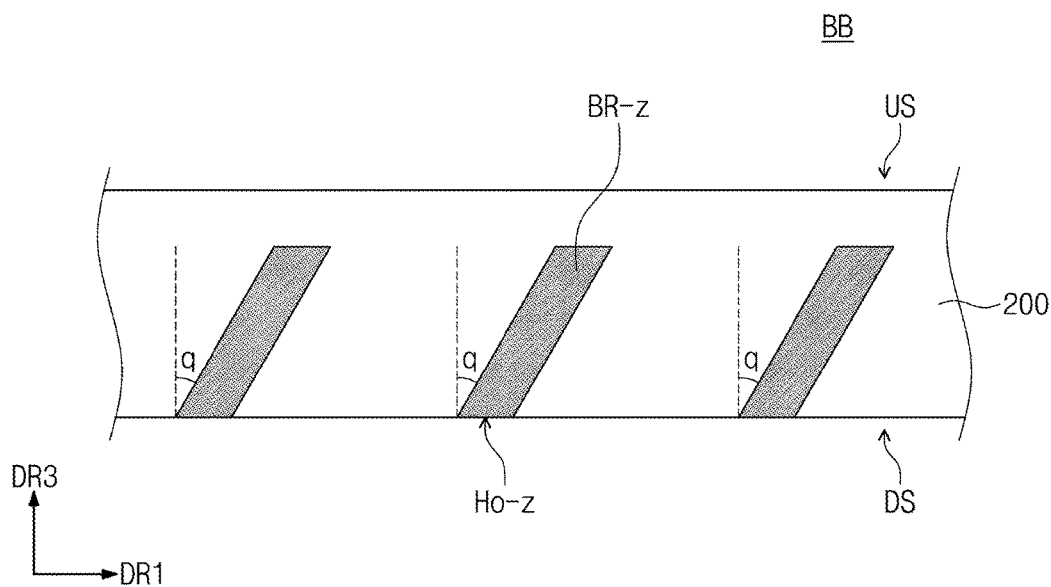
Figure 10:
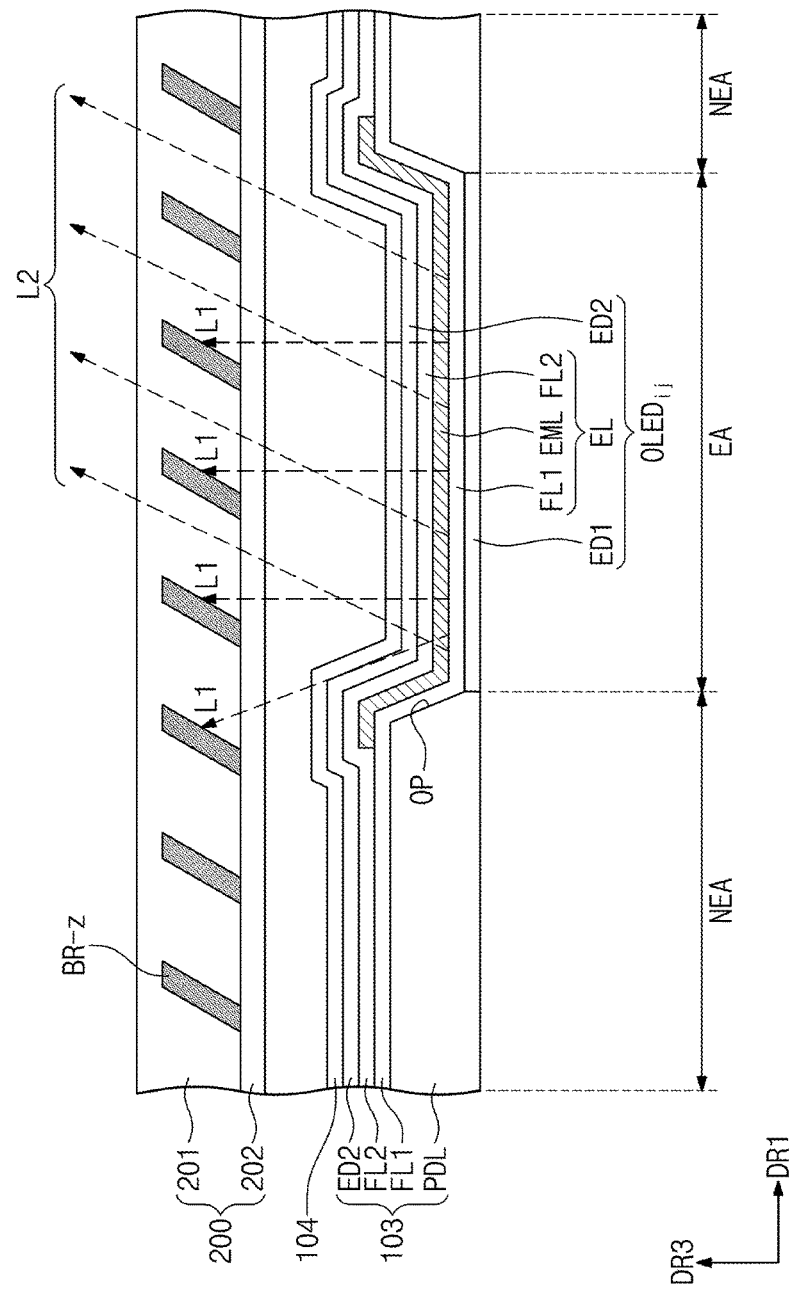
FIG. 10 is a partial cross-sectional view of a display panel of FIG. 8.

FIG. 8 is a cross-sectional view taken along line I-I' of FIG. 3A according to another embodiment of the inventive concept. FIGS. 9A and 9B are enlarged views of an area BB of FIG. 8. FIG. 10 is a partial cross-sectional view of a display panel of FIG. 8.

A display panel DP-z of FIGS. 8 to 10 may be substantially the same as the display panel DP of FIG. 4 except for only constituents of a second base layer 201. Thus, descriptions with respect to other constituents will be omitted. Referring to FIGS. 8 to 10, the protection layer 200 disposed on the second substrate 200 is omitted. That is, the second substrate 200 may be substantially the same as the second base layer 201.

In detail, referring to FIGS. 8 to 10, the second substrate 200 may include a top surface US and a bottom surface DS. The top surface US may face the bottom surface DS in the third direction DR3, and the bottom surface DS may face the first substrate 100 in the third direction DR3.

According to an embodiment of the inventive concept, a plurality of grooves Ho-z arranged in the first direction DR1 and extending to form a predetermined angle q with respect to the third direction DR3 may be defined in the bottom surface DS. Each of the grooves Ho-z may have a width having a first length d1b in the first direction DR1. Each of the grooves Ho-z may have a thickness having a second length d2b in the third direction DR3. Also, a distance between the grooves Ho-z may have a third length d3b in the first direction DR1.

Also, inner side surface INSa defining the grooves Ho-z includes a first side surface INS1a and a second side surface INS2a, which face each other in the first direction DR1 and a bottom surface INS3a connecting the first side surface INS1a to the second side surface INS2a.

According to an embodiment of the inventive concept, the inner side surface INSa defining the grooves Ho-z may be inclined in the first direction DR1 at a predetermined angle q with respect to the third direction DR3. In detail, at least two side surfaces of the inner side surface INSa may be inclined at a predetermined angle q with respect to the third direction DR3. Here, the predetermined angle q may be an angle ranging from 0 degree to 45 degrees.

The predetermined angle q may change according to the structure in which the display device DD is disposed. For example, the predetermined angle q may be adjusted so that an image would not be seen on the windshield of the vehicle regardless of the exact structure in which the display device DD is disposed in the vehicle.

The light blocking member BR-z may be disposed on each of the grooves Ho-z. That is, the light blocking member BR-z may be disposed on the inner side surface INSa. Also, as described with reference to FIGS. 7A and 7B, the grooves Ho-z of FIGS. 8 to 10 may be defined in the bottom surface DS of the second substrate 200 to the display area DA. That is, the grooves Ho-z may not overlap the non-display area NDA.

Also, the grooves Ho-z defined in the bottom surface DS may not overlap the non-display area NDA and overlap the display area DA. Particularly, the grooves Ho-z may overlap the emission area EA of the display area DA and do not overlap the non-emission area NEA.

Referring to FIGS. 4 and 8, although the grooves having the same shape are defined in the bottom surface DS of the second substrate 200, the embodiment of the inventive concept is not limited thereto. For example, although not shown, the grooves Ho-z may be defined in different shapes in the bottom surface DS according to the structure in which the display device DD is disposed. For example, the grooves Ho of FIG. 4 may be defined in one portion of the bottom surface DS, and the grooves Ho-z of FIG. 8 may be defined in the other portion of the bottom surface DS.

Referring to FIG. 10, the light blocking member BR-z may be arranged at a predetermined distance in the first direction and filled into each of the grooves Ho-z.

Also, as described above, the light blocking members BR-z may absorb the first light L1 transmitted from the light emitting pattern EML. As a result, the first light L1 transmitted to the light blocking member BR-z may not be transmitted to the outside through the display surface.

On the other hand, the second light L2 outputted from the light emitting pattern EML to pass through the light blocking members BR-z may be transmitted to the outside through the display surface. In this case, the second light L2 may be travelled to a direction which is inclined at a predetermined angle from the third direction DR3 to the first direction DR1.

The traveling direction of the light outputted through the display surface of the display device DD may be uniform through the above-described structure.

Figure 11:
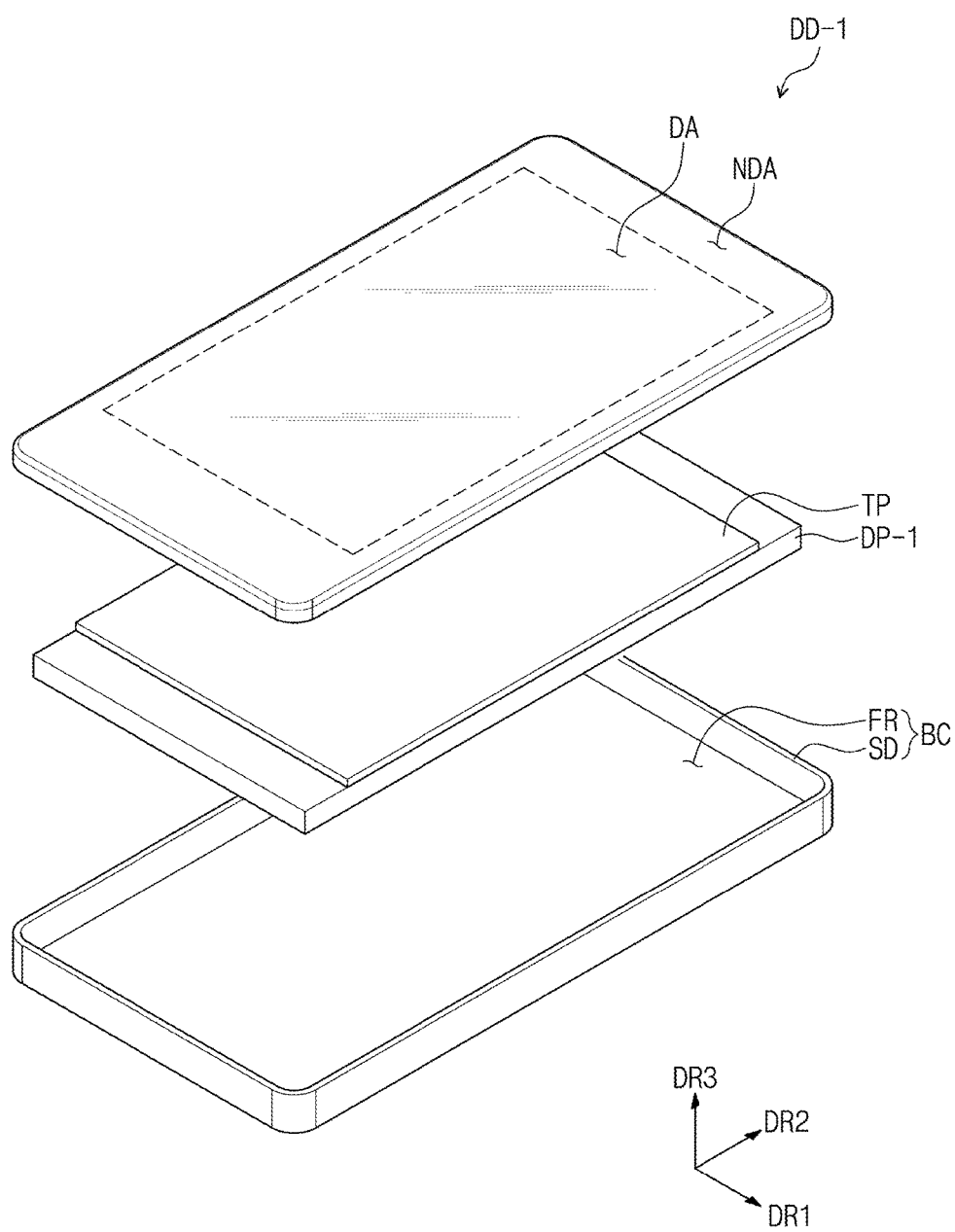
FIG. 11 is an exploded perspective view of a display device according to another embodiment of the inventive concept.
Figure 12:
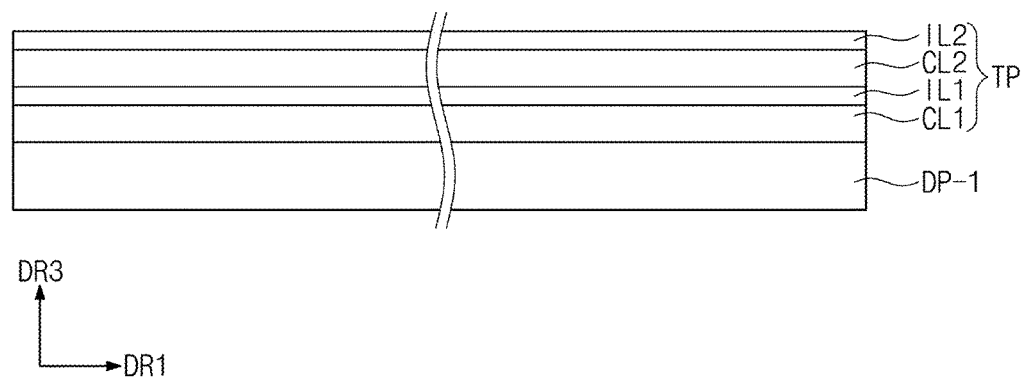
FIG. 12 is a cross-sectional view of a touch sensing unit according to an embodiment of the inventive concept.

FIG. 11 is an exploded perspective view of a display device according to another embodiment of the inventive concept. FIG. 12 is a cross-sectional view of a touch sensing unit according to an embodiment of the inventive concept.

A display device DD-1 of FIG. 11 may be substantially the same as the display device DD of FIG. 1 except for a touch sensing unit TP, and thus, other constituents may be substantially the same. Thus, descriptions with respect to other constituents except for the touch sensing unit TP may be omitted.

Referring to FIGS. 11 and 12, the touch sensing unit TP may be disposed between a window member WM and a display panel DP-1.

Particularly, the touch sensing unit TP according to an embodiment of the inventive concept may have an on-cell structure in which the touch sensing unit TP is disposed on the display panel DP. However, a position relationship between the display panel DP-1 and the touch sensing unit TP is not limited thereto. For example, the touch sensing unit TP may be realized as an in-cell structure in which the touch sensing unit TP is disposed in the display panel DP-1.

As illustrated in FIG. 12, the touch sensing unit TP includes a first conductive layer CL1, a first touch insulation layer IL1, a second conductive layer CL2, and a second touch insulation layer IL2.

Each of the first conductive layer CL1 and the second conductive layer CL2 may have a single-layered structure or a multi-layered structure in which a plurality of layers are laminated in the third directional axis DR3. The conductive layer having the multi-layered structure may include a transparent conductive layer and at least one metal layer.

The conductive layer having the multi-layered structure may include metal layers including metals different from each other. The transparent conductive layer may include indium tin oxide (ITO), indium zinc oxide (IZO), zinc oxide (ZnO), or indium tin zinc oxide (ITZO), PEDOT, a metal nano wire, and graphene. The metal layer may be formed of molybdenum, silver, titanium, copper, aluminum, and an alloy thereof.

Each of the first and second conductive layers CL1 and CL2 may include a plurality of patterns. Hereinafter, a structure in which the first conductive layer CL1 includes first conductive patterns, and the second conducive layer CL2 includes second conductive patterns will be described. Each of the first and second conductive patterns may include touch electrodes and touch signal lines.

Each of the first and second touch insulation layers IL1 and IL2 may be formed of inorganic or organic material. The inorganic material may include silicon oxide or silicon nitride. The organic material may include at least one of an acrylic-based resin, a methacrylic-based resin, a polyisoprene-based resin, a vinyl-based resin, an epoxy-based resin, a urethane-based resin, a cellulose-based resin, or a perylene-based resin. If the first touch insulation layer IL1 insulates the first and second touch insulation layers CL1 and CL2 from each other, the embodiment of the inventive concept is not limited to the shape of the first touch insulation layer IL1. The first touch insulation layer IL1 may be deformed in shape according to the shapes of the first and second conductive patterns. The first touch insulation layer IL1 may entirely cover a second base layer 201 of a second substrate 200 that will be described later in detail or include a plurality of insulation patterns.

According to the descriptions of the inventive concept, a 1-layered capacitive touch screen is illustrated as an example. However, the touch sensing unit TP may be driven in a self capacitance manner. Also, the embodiment of the inventive concept is not limited to the driving manner of the touch screen for acquiring the coordinate information. That is, although not shown, the touch sensing unit TP may be provided as a 2-layered capacitive touch screen.

Figure 13A:
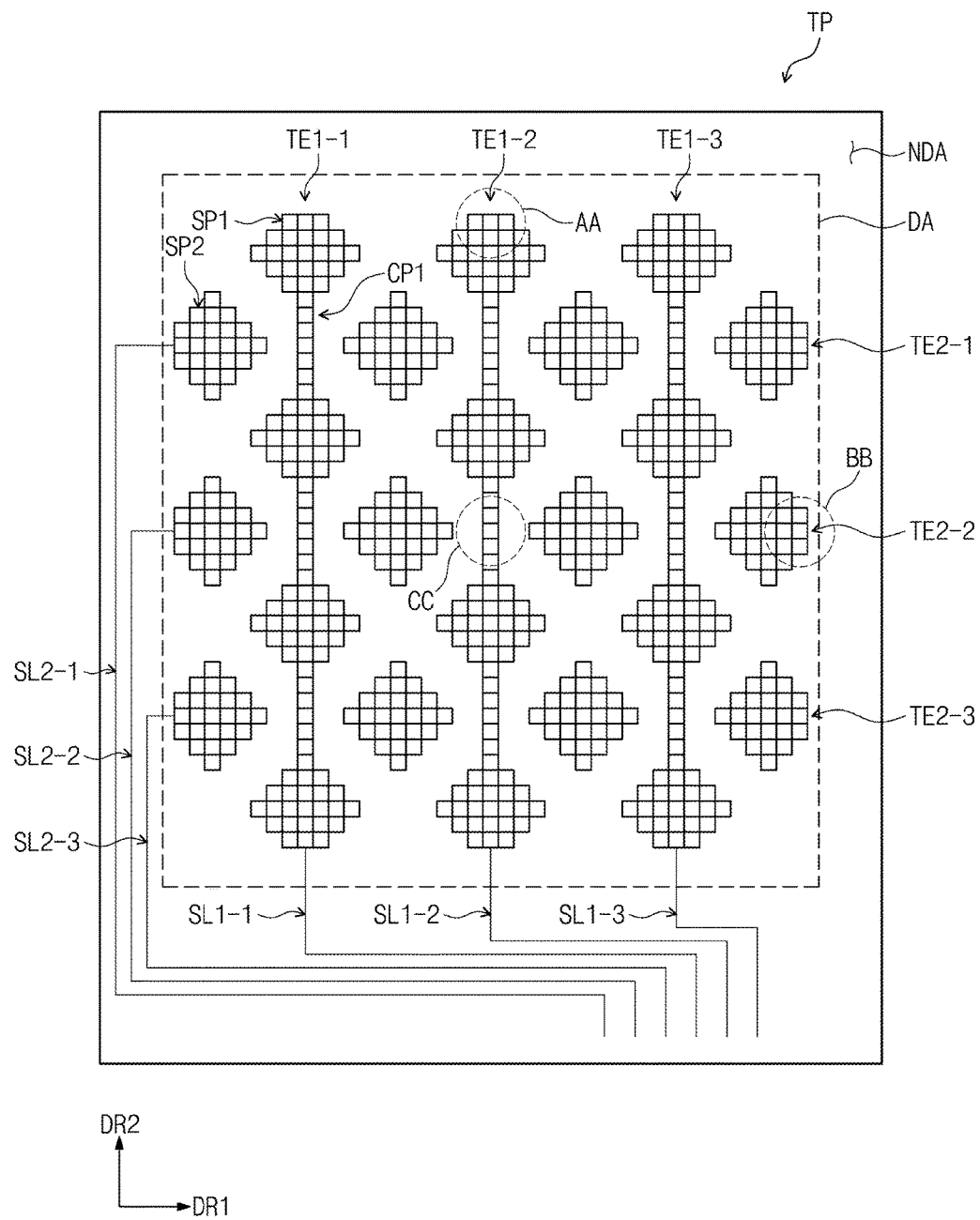
FIGS. 13A and 13B are plan views of the touch sensing unit according to an embodiment of the inventive concept.
Figure 13B:
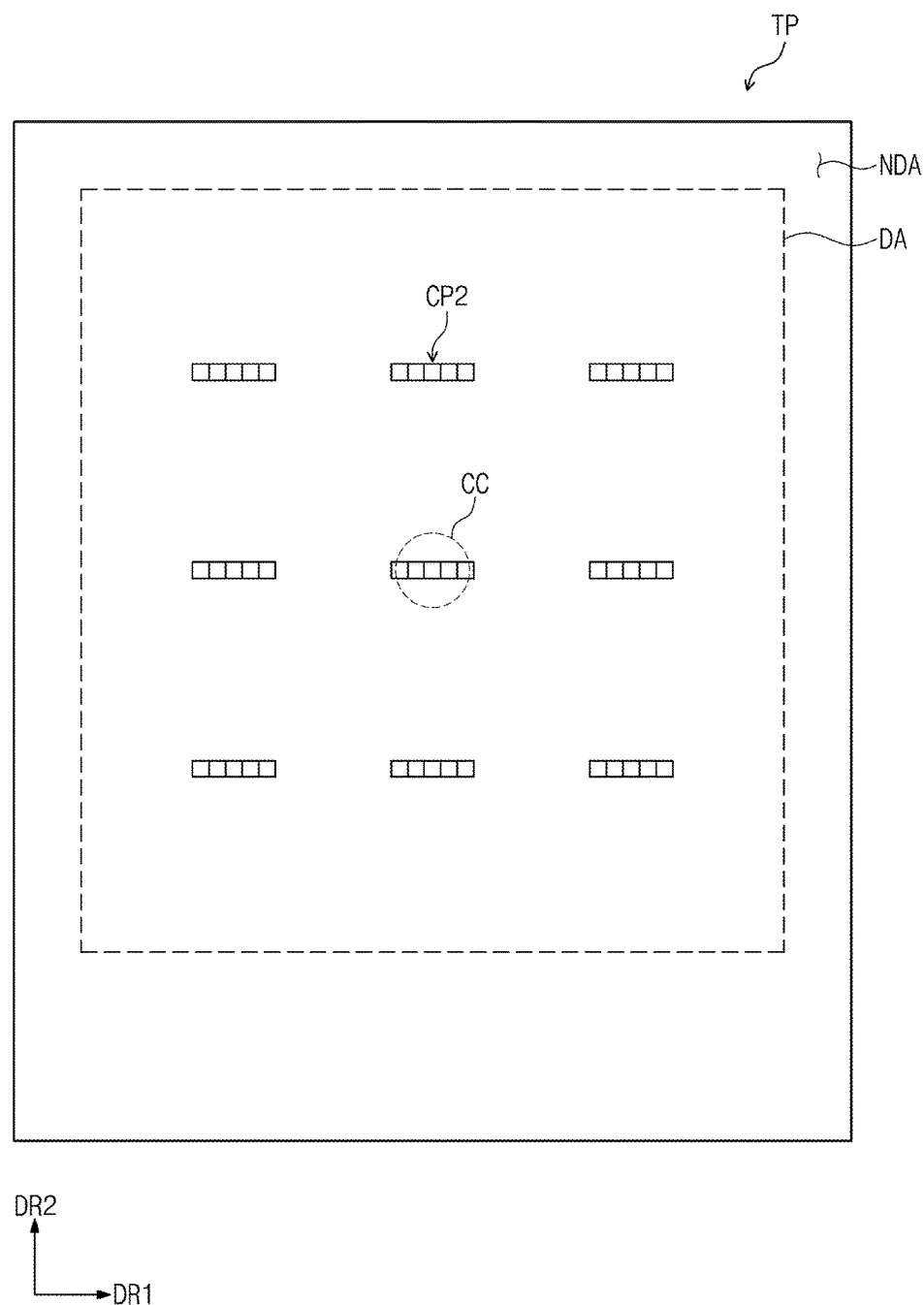
Figure 13C:
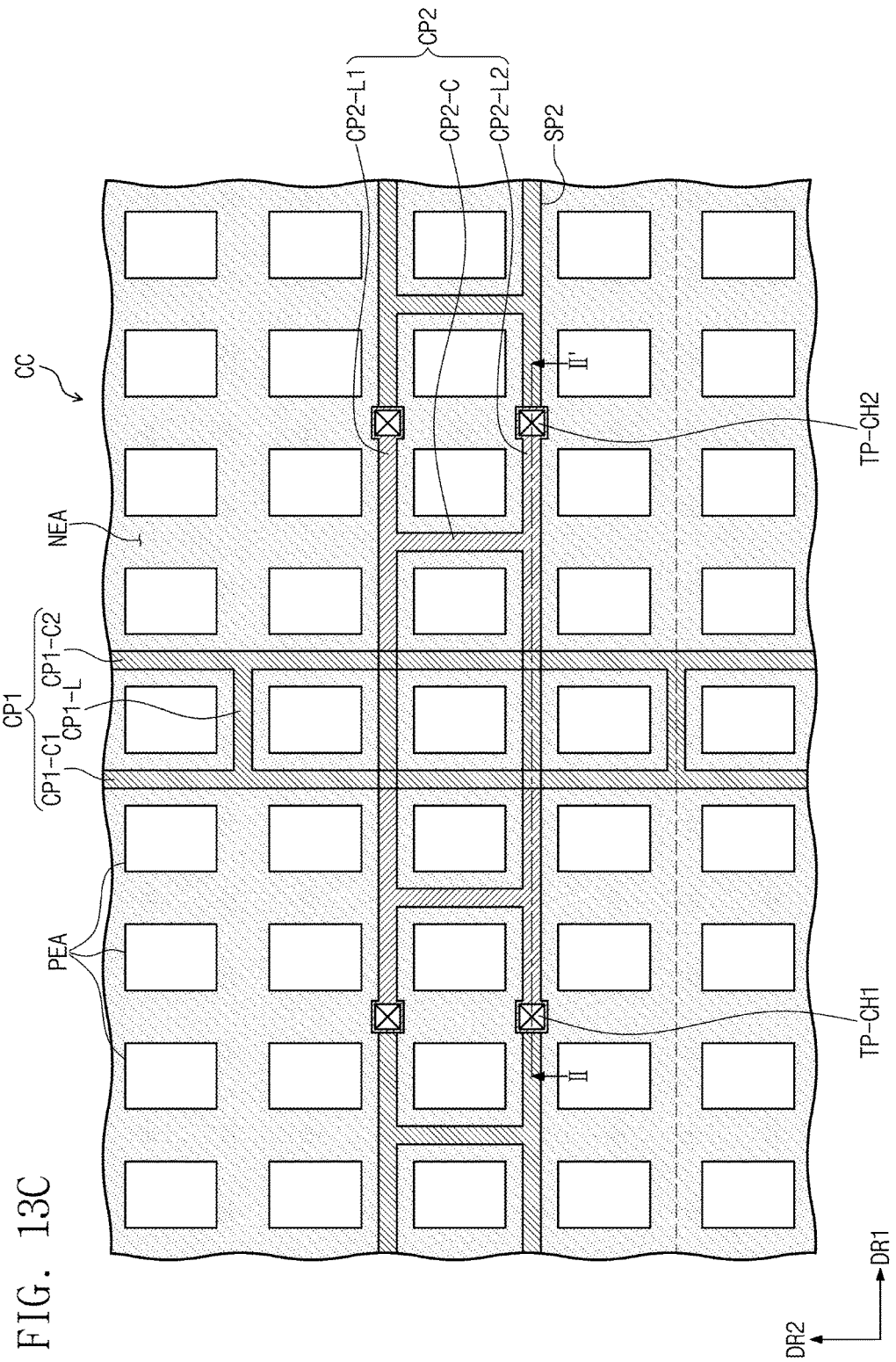
FIG. 13C is a partial enlarged plan view of an area CC of FIG. 13B.
Figure 13D:
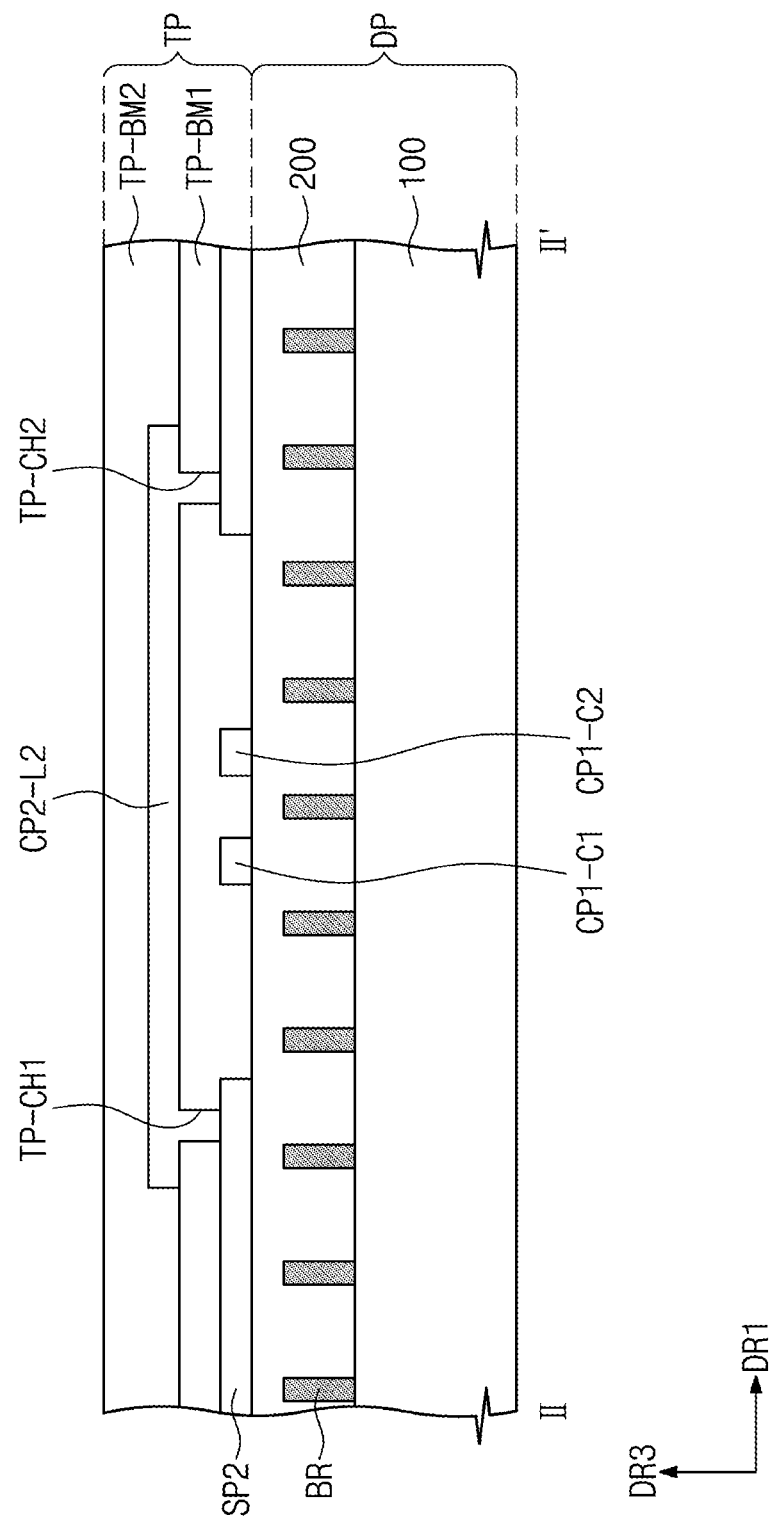
FIG. 13D is a cross-sectional view taken along line II-II' of FIG. 13C.

FIGS. 13A and 13B are plan views of the touch sensing unit according to an embodiment of the inventive concept. FIG. 13C is a partial enlarged plan view of an area CC of FIG. 13B. FIG. 13D is a cross-sectional view taken along line II-II' of FIG. 13C.

As described above, the touch sensing unit TP of FIGS. 13A to 13D may be provided as the 1-layered capacitive touch screen.

Referring to FIG. 13A, the first conductive patterns may include first touch electrodes TE1-1 to TE1-3, first touch signal lines SL1-1 to SL1-3, second sensing parts SP2 of second touch electrodes TE2-1 to TE2-3, and second touch signal lines SL2-1 to SL2-3. The first sensing parts SP1 may be arranged in the first direction DR1, and the second sensing parts SP2 may be arranged in the second direction DR2.

Each of the first touch electrodes TE1-1 to TE1-3 includes a plurality of first sensing parts SP1 and a plurality of first connection parts CP1. Each of the second touch electrodes TE2-1 to TE2-3 includes a plurality of second sensing parts SP2. That is, the first sensing parts SP1, the first connection parts CP1, and the second sensing parts SP2 may be disposed on the same layer.

Referring to FIG. 13B, in the second conductive patterns, second connection parts CP2 connect the second touch electrode TE2-1, TE2-2, and TE2-3 to each other in the first direction DR1. That is, each of the second connection parts CP2 plays a bridge function.

The first sensing parts SP1 overlaps the non-emission area NEA that is adjacent to the emission area EA. Each of the first sensing parts SP1 and the second connection parts CP1 may be defined in a mesh having a touch opening. The mesh may have a line width of several micrometers.

Each of the first sensing parts SP1 and the first connection parts CP1 may be defined in the form of a mesh having a touch opening. Each of the second sensing parts SP2 and the second connection parts CP2 may have the form of a mesh having the above-described touch opening. The touch opening may have a one-to-one correspondence to the emission area EA or correspond to two or more emission areas EA. That is, two or more emission areas EA may be disposed inside one touch opening.

As illustrated in FIGS. 13A and 13B, the first connection part CP1 may include first vertical portions CP1-C1 and CP1-C2 disposed on the second substrate 200 and first horizontal portions CP1-L connecting the first vertical portions CP1-C1 and CP1-C2 to each other. Here, although two first vertical portions CP1-C1 and CP1-CP are illustrated, the embodiment of the inventive concept is not limited thereto.

The second connection parts CP2 may second horizontal portions CP2-L1 and CP2-L2 disposed on a first black matrix TP-BM1 and second vertical portions CP2-C connecting the second horizontal portions CP2-L1 and CP2-L2 to each other. The first connection parts CP1 may have a mesh shape, and also, the second connection parts CP2 may have a mesh shape.

The connection parts CP2 electrically connect two second sensing parts SP2, which are adjacent to each other in the first direction DR, of the second sensing parts SP2 through first and second through holes TP-CH1 and TP-CH2 passing through the first black matrix TP-BM1.

A second black matrix TP-BM2 may be enough to overlap the second connection part CP2. That is, the second black matrix TP-BM2 may overlap only a portion of the non-emission area NEA.

As illustrated in FIGS. 13A to 13D, a structure in which the first sensing parts SP1, the first connection parts CP1, and the second sensing parts SP2 are disposed on the same layer is described. However, the technical ideas of the inventive concept are not limited thereto.

For example, the first sensing parts SP1, the first connection parts CP1, and the second connection parts CP2 may be disposed on the same first layer, and the second sensing parts SP2 may be disposed on a second layer different from the first layer. Similarly, in this case, the second connection parts CP2 may electrically connect the second sensing parts SP2 to each other through the first and second contact holes TP-CH1 and TP-CH2.

Referring to FIG. 13D, it is seen that the touch sensing unit TP is disposed on the display panel DP-1 of FIG. 4 according to an embodiment of the inventive concept.

Figure 14A:
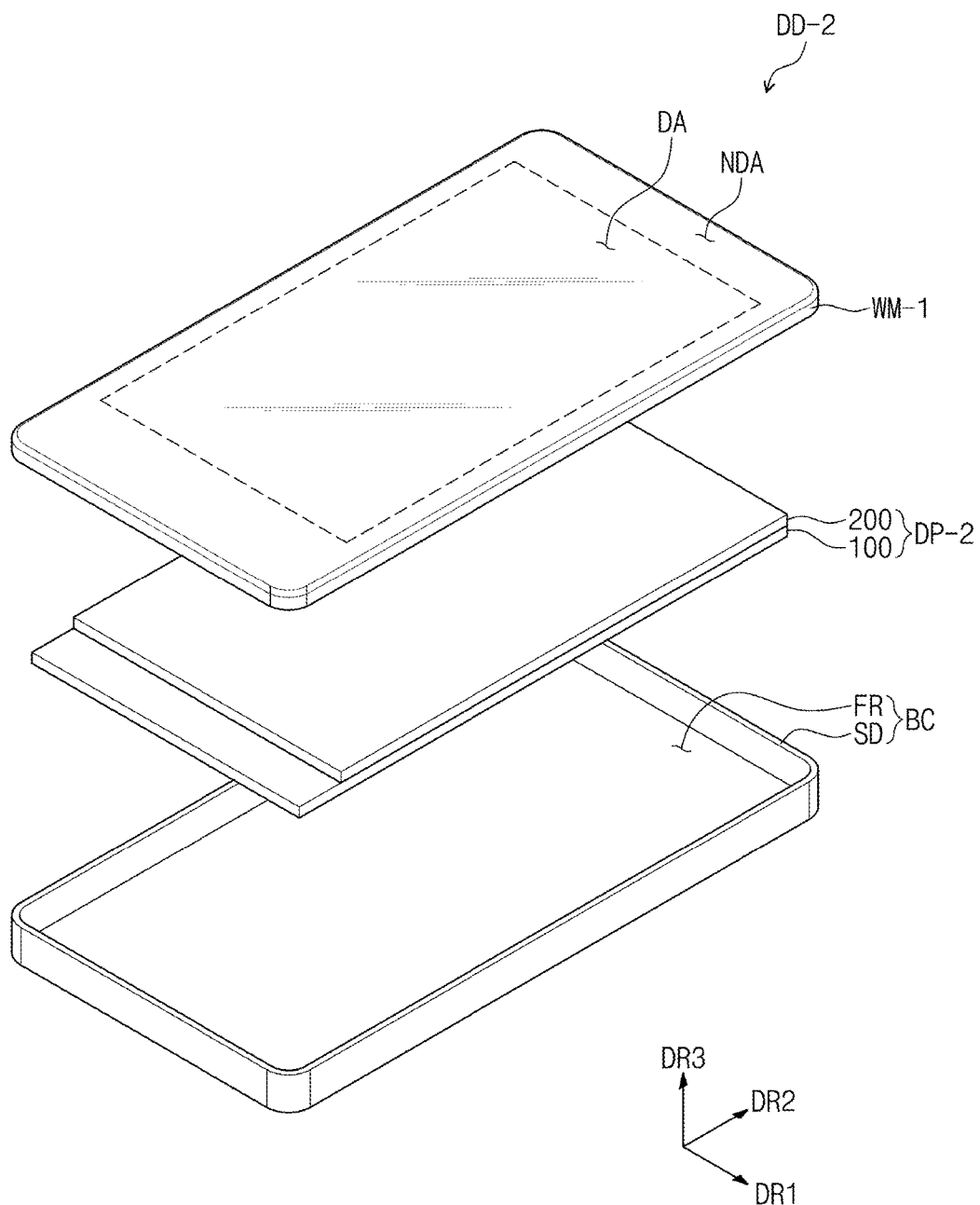
FIG. 14A is an exploded perspective view of a display device according to another embodiment of the inventive concept.
Figure 14B:
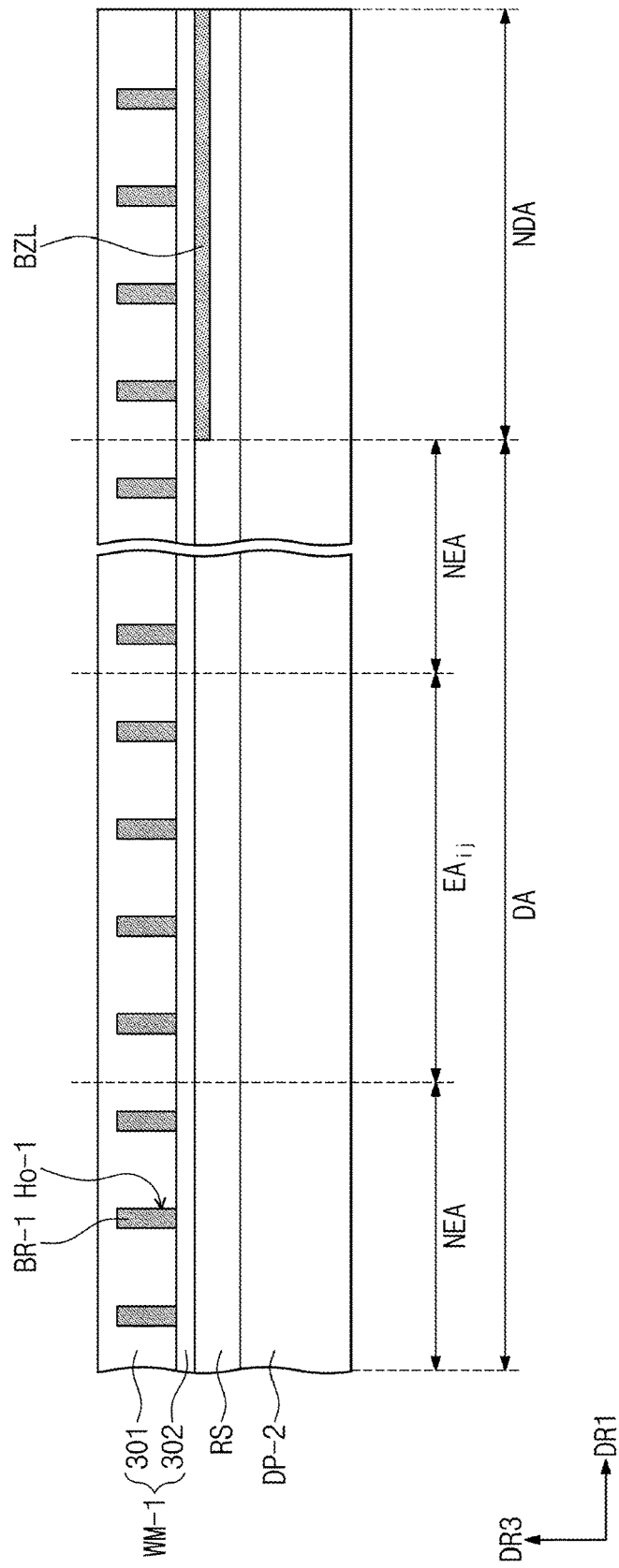
FIG. 14B is a cross-sectional view taken along line of FIG. 14.

FIG. 14A is an exploded perspective view of a display device according to another embodiment of the inventive concept. FIG. 14B is a cross-sectional view taken along line III-III' of FIG. 14.

A display device DD-2 of FIGS. 14A and 14B may be substantially the same as the display device DD of FIG. 1 except that a light blocking member BR is disposed on a window member WM, but not disposed on the display panel DP-2. That is, the display device DD-2 may have substantially the same constituent as the display device DD of FIG.

1 except for a light blocking member BR. Thus, descriptions with respect to other constituents will be omitted.

Referring to FIGS. 14A and 14B, a window member WM-1 includes a base layer 301 and a protection layer 302 disposed on the base layer 301. Also, as illustrated in FIG. 1, the window member WM-1 may further include a bezel layer BZL. The bezel layer BZL may block light provided from the display panel DP-2. The bezel layer BZL may be disposed on the base layer 301 to overlap the non-display area NDA. The bezel layer BZL may have various colors according to the product implementation. Hereinafter, the window member WM-1 may substantially represent the base layer 301.

An adhesion layer RS may be disposed between the window member WM-1 and the display panel DP-2. Here, the adhesion layer RS may be a resin layer. That is, an encapsulation substrate that is defined as a second substrate of the display panel DP-2 and the window member WM-1 may adhere to each other by using the adhesion layer RS. For example, the adhesion layer RS may be cured by being irradiated by external ultraviolet rays. Here, the window member WM-1 and the encapsulation substrate of the display panel DP-2 may be directly coupled to each other by the adhesion layer RS.

However, the technical ideas of the inventive concept are not limited thereto. For example, the window member WM-1 and the encapsulation substrate of the display panel DP-2 may not be directly coupled to each other by the adhesion layer RS. That is, when a touch sensing unit is disposed above the encapsulation substrate, the window member WM-1 and the touch sensing unit may be coupled to each other by the adhesion layer RS.

In detail, the window member WM-1 may include a top surface and a bottom surface. The top surface may face the bottom surface in the third direction DR3, and the bottom surface may face the display panel DP-2 in the third direction DR3.

According to an embodiment of the inventive concept, a plurality of grooves Ho-1 arranged in the first direction DR1 and extending in the third direction DR3 may be defined in the bottom surface of the window member WM-1. A light blocking member BR-1 may be filled into the grooves Ho-1. A protection layer 302 may be disposed on the base layer 301 to cover the grooves Ho-1. As a result, the light blocking member BR-1 does not leak from the grooves Ho-1.

As illustrated in FIG. 14B, the grooves Ho-1 may be defined in the bottom surface to overlap the display area DA. However, the technical ideas of the inventive concept are not limited thereto. For example, the grooves Ho-1 may be defined in the bottom surface DS-1 to overlap only the display area DA. That is, grooves Ho-1 may not overlap the non-display area NDA.

Also, the grooves Ho-1 defined in the bottom surface DS-1 may overlap an emission area EA of the display area DA and do not overlap a non-emission area NEA.

Although not shown, the display device DD-2 may further include a touch sensing unit disposed between the window member WM-1 and the display panel DP-2. That is, the touch sensing unit TP of FIG. 11 may be disposed on the display panel DP-2.

As described above, the display device according to an embodiment of the inventive concept may have a structure in which the light blocking member BR is disposed on the window member WM or the second substrate 200 of the display panel DP.

For example, in the display device according to an embodiment of the inventive concept, a substrate 100 may be provided as a lower substrate, and a second substrate 200 the light blocking member BR is disposed may be provided as an upper substrate disposed above the lower substrate. In this case, the lower substrate may be a substrate including a light emitting layer, and the upper substrate may be the encapsulation substrate.

For example, in the display device according to an embodiment of the inventive concept, the first substrate 100 may be provided as a lower substrate, and the second substrate 200 on which the light blocking member BR is disposed may be provided as an upper substrate disposed above the lower substrate. In this case, the lower substrate may be a substrate including the light emitting layer, and the upper substrate may be the window member WM.

FIGS. 15A to 15E are views illustrating a method for manufacturing a display device according to another embodiment of the inventive concept.

According to an embodiment of the inventive concept, a substrate ST of FIGS. 15A to 15E may be a substrate that provided in a window member and a display panel according to the inventive concept.

Figure 15A:
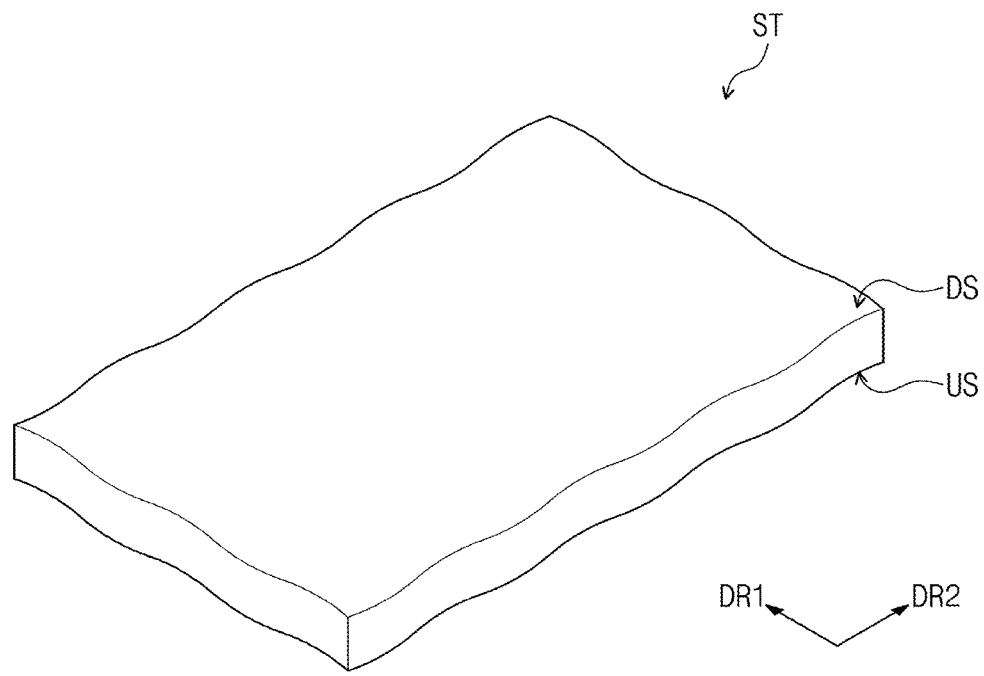
FIGS. 15A, 15B, 15C, 15D, and 15E are views illustrating a method for manufacturing a display device according to another embodiment of the inventive concept.

Referring to FIG. 15A, the substrate ST may be prepared. For example, the substrate ST may include glass, sapphire, plastic, and the like. Also, the substrate ST may include a top surface US and a bottom surface DS facing the top surface US.

Figure 15B:
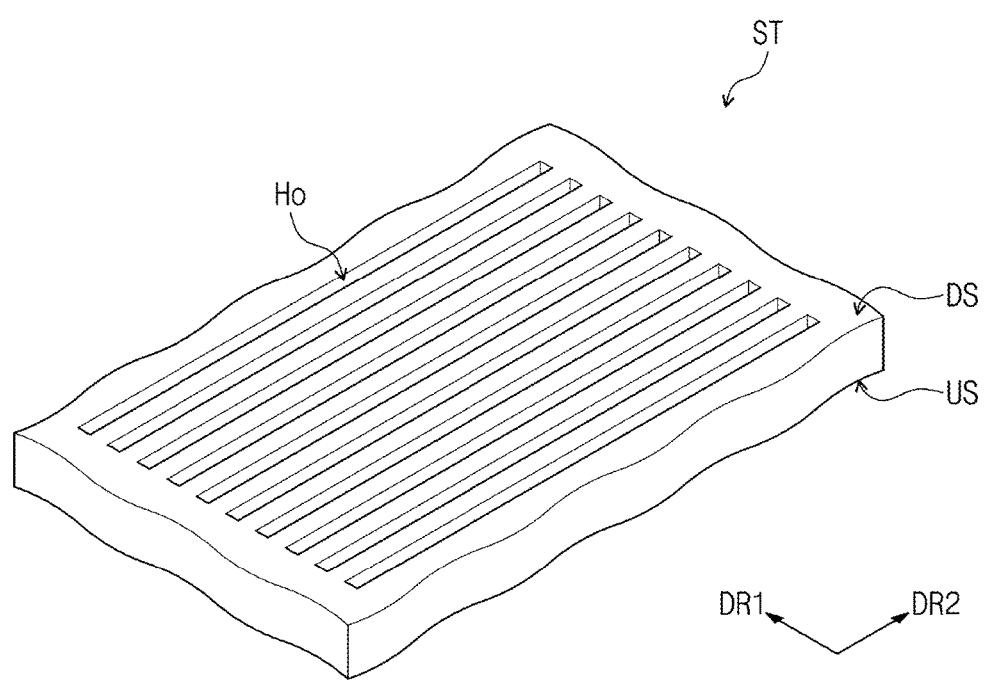

Referring to FIG. 15B, a plurality of grooves Ho arranged in a first direction DR1 and extending in a third direction DR3 perpendicular to the first direction DR1 may be formed in the bottom surface DS. For example, the grooves Ho may be intagliated by using laser or etched through a separate pattern layer to form the bottom surface DS. A method for forming the groove Ho in the bottom surface DS may be performed through various manners in addition to the above-described manner.

Figure 15C:
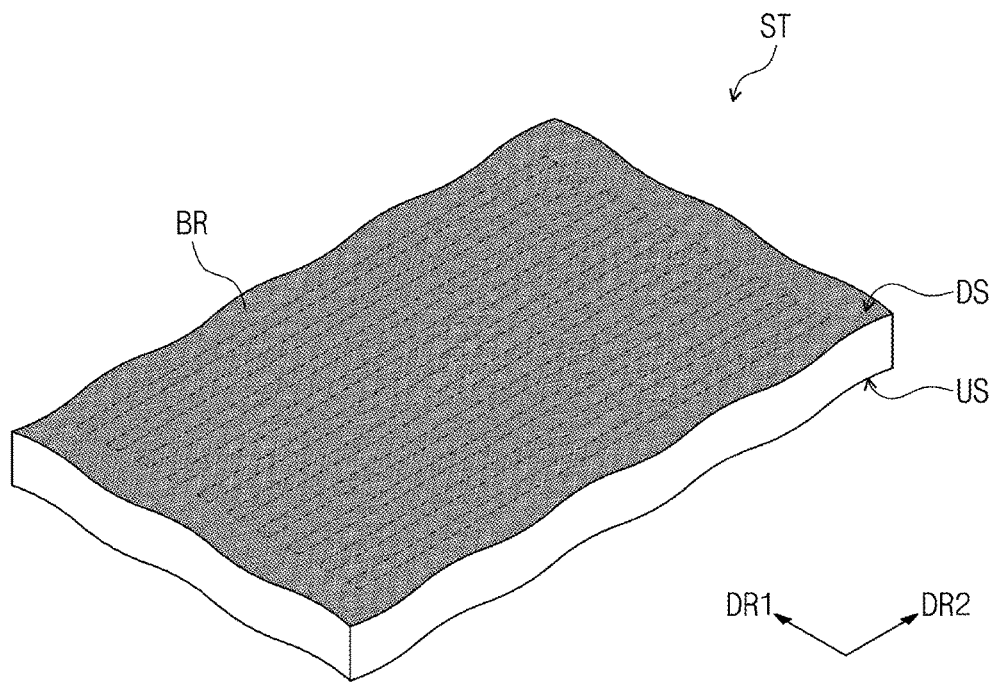

Referring to FIG. 15C, a light blocking member BR may be applied to the bottom surface DS in which the grooves Ho are formed. In this case, the light blocking member BR may be filled into the grooves Ho. According to an embodiment, the light blocking member BR may include a resin having a black color.

Figure 15D:
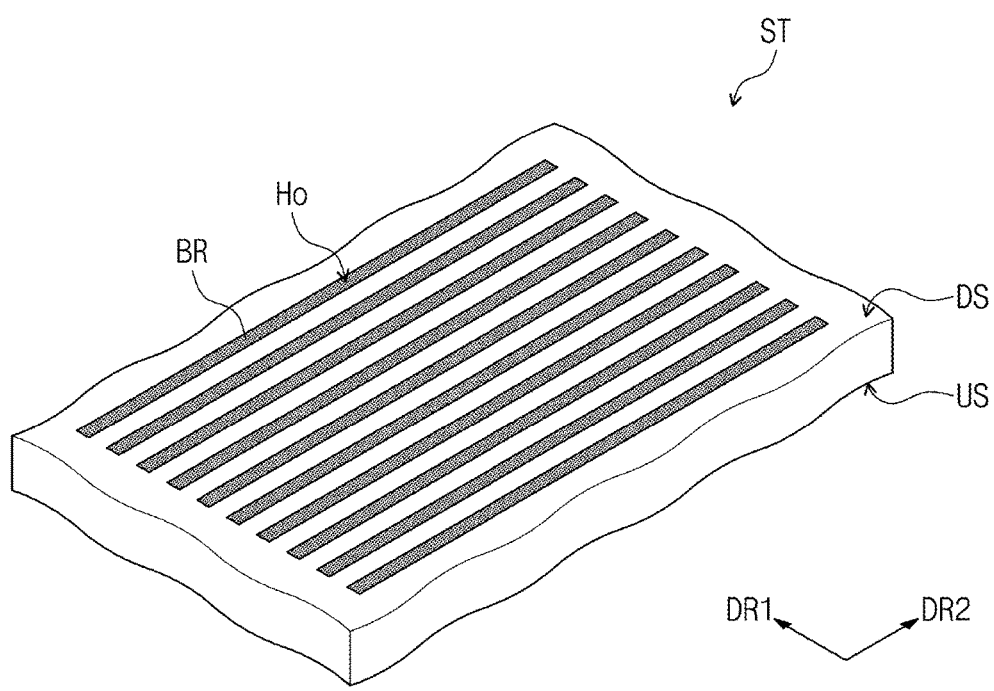

Referring to FIG. 15D, since the light blocking member BR is disposed on an entire surface of the bottom surface D, the rest area of the bottom surface DS except for the area in which the grooves Ho are defined may be cleaned. As a result, the light blocking member BR may be filled into only the grooves Ho.

Figure 15E:
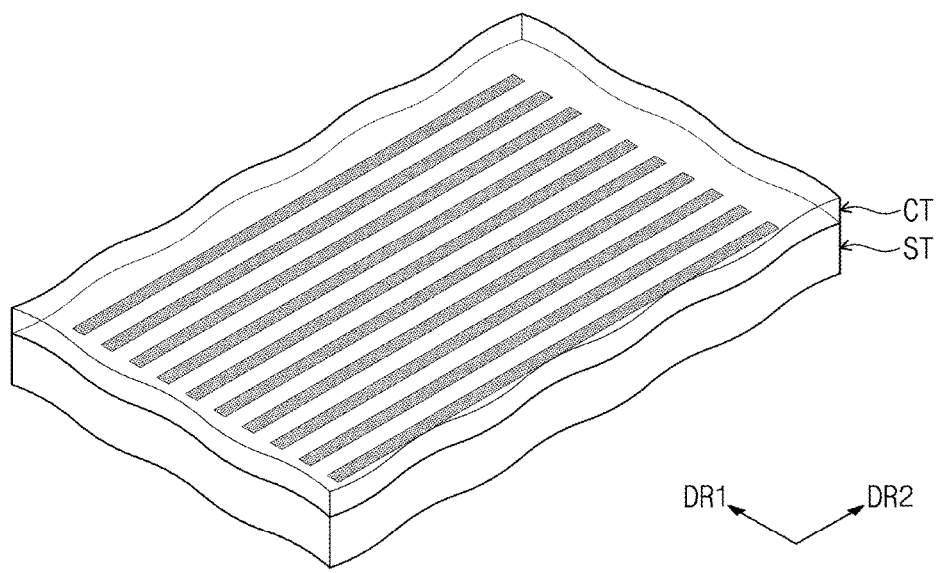

Referring to FIG. 15E, a protection layer CT may be disposed on the bottom surface DS. That is, the protection layer CT may prevent the light blocking member BR filled into the grooves Ho from leaking to the outside. For example, the protection layer CT may be disposed on the bottom surface DS as an organic layer coating layer or disposed on the bottom surface DS as a separate film type.

Figure 16:
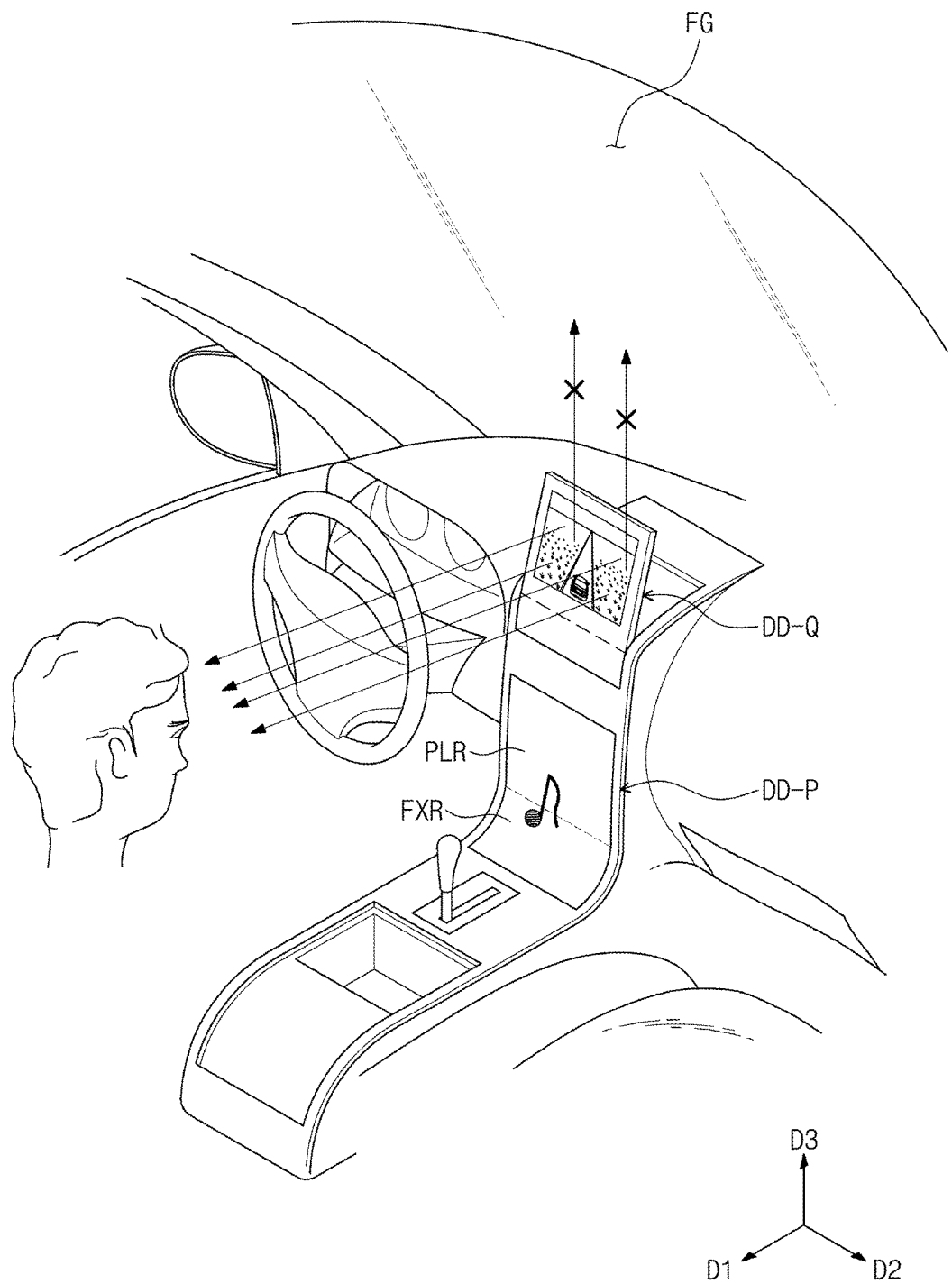
FIG. 16 is a view illustrating an example of the display device according to an embodiment of the inventive concept.

FIG. 16 is a view illustrating an example of the display device according to an embodiment of the inventive concept.

For example, FIG. 16 illustrates a state in which the display device according to an embodiment of the inventive concept is mounted in a vehicle. Hereinafter, a structure in which a first display device DD-Q and a second display device DD-P are mounted adjacent to a driver's seat within the vehicle will be described.

According to an embodiment of the inventive concept, the first display device DD-Q may be a flat display device. For example, the first display device DD-Q may be a navigation for displaying traffic information. The second display device DD-P may be a display device for displaying information such as news. A display surface of the first display device DD-Q may be disposed within the vehicle to face user's eyes. That is, the display surface of the first display device DD-Q may be a surface that is parallel to the second direction D2 and the third direction D3 and face the user's eyes in the first direction D1.

As described above, light may be emitted from the display surface of the first display device DD-Q in the first direction D1 by the light blocking member. That is, since the light is not emitted from the display surface of the first display device DD-Q in the third direction D3, an image may not be displayed on a windshield FG.

Also, the second display device DD-P may be a flexible display device. Particularly, a first area PLR having a flat display surface and a second area FXR having a curved display surface may be defined on the second display device DD-P.

According to an embodiment of the inventive concept, the light blocking member of FIG. 4 may be applied to the first area PLR, and the light blocking member of FIG. 8 may be applied to the second area FXR.

According to the embodiment of the inventive concept, the plurality of grooves arranged in the first direction and extending in the third direction perpendicular to the first direction may be defined in the display panel or the window member. The light blocking member blocking light may be disposed in each of the plurality of grooves.

That is, the light blocking member may control the propagation direction of the light outputted from the display surface. Therefore, the image provided from the display device for the vehicle may not be seen or reflected on the windshield of the vehicle.

Hereinabove, the embodiment is disclosed in the drawings and the specification. While specific terms were used, they were not used to limit the meaning or the scope of the inventive concept described in claims, but merely used to explain the inventive concept. Accordingly, a person having ordinary skill in the art will understand from the above that various modifications and other equivalent embodiments are also possible. Hence, the real protective scope of the present invention shall be determined by the technical scope of the accompanying claims.

What is claimed is:

1. A display device comprising:
   a first substrate comprising a first base layer, a circuit layer disposed on the first base layer, and a light emitting layer disposed on the circuit layer;
   a second substrate comprising a top surface and a bottom surface, facing the first substrate and spacing apart from the first substrate in the thickness direction with the light emitting layer disposed between the first base layer and the second substrate, the bottom surface facing the light emitting layer and having a plurality of grooves being defined in the second substrate; and
   a plurality of light blocking members disposed on the plurality of grooves,
   wherein the plurality of grooves are recessed from the bottom surface of the second substrate and arranged in a first direction.

2. The display device of claim 1, wherein the second substrate comprises:
   a second base layer in which the plurality of grooves are defined; and
   a protection layer disposed on the second base layer to cover the plurality of grooves.

3. The display device of claim 2, wherein the first substrate includes a display area and a non-display area that surround the display area,
   a plurality of emission areas and a plurality of non-emission areas that are adjacent to the plurality of emission areas are defined on the display area, and
   the plurality of light blocking members overlap the display area and do not overlap the non-display area.

4. The display device of claim 3, wherein one of the plurality of grooves crosses at least two adjacent emission areas among the plurality of emission areas.

5. The display device of claim 3, further comprising a sealing member configured to couple the first substrate to the second substrate,
   wherein the sealing member overlaps the non-display area.

6. The display device of claim 2, further comprising a touch sensing unit disposed on the second base layer.

7. The display device of claim 1, wherein each of the plurality of grooves has a first side surface, a second side surface, and a bottom surface configured to connect the first and second side surfaces to each other, and
   the first side surface and the second side surface are parallel to a thickness direction of the second substrate.

8. The display device of claim 7, wherein each of the plurality of grooves has a width of about 5 micro meters to about 20 micro meters in the first direction and a depth of about 100 micro meters to about 500 micro meters in the thickness direction.

9. The display device of claim 8, wherein the plurality of grooves are arranged with a uniform distance therebetween, the distance being between about 30 micro meters to about 150 micro meters.

10. The display device of claim 1, wherein each of the plurality of grooves has a first side surface, a second side surface, and a bottom surface configured to connect the first and second side surfaces to each other, and
    the first side surface and the second side surface are inclined at a predetermined angle with respect to the bottom surface.

11. The display device of claim 1, wherein the light blocking member comprises a black resin.

12. The display device of claim 1, wherein the top surface of the second substrate is entirely flat.

13. The display device of claim 1, further comprising a sealing member disposed between the first substrate and the second substrate.

* * * * *